United States Patent
Lee et al.

(10) Patent No.: US 12,353,769 B2
(45) Date of Patent: Jul. 8, 2025

(54) MEMORY DEVICE AND OPERATION METHOD THEREOF

(71) Applicant: Samsung Electronics Co., Ltd., Suwon-si (KR)

(72) Inventors: Sooyong Lee, Suwon-si (KR); Jae Hyun Choi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 62 days.

(21) Appl. No.: 18/535,027

(22) Filed: Dec. 11, 2023

(65) Prior Publication Data

US 2024/0377988 A1 Nov. 14, 2024

(30) Foreign Application Priority Data

May 11, 2023 (KR) .................. 10-2023-0061274

(51) Int. Cl.
   *G06F 3/06* (2006.01)

(52) U.S. Cl.
   CPC .......... *G06F 3/0659* (2013.01); *G06F 3/0619* (2013.01); *G06F 3/0673* (2013.01)

(58) Field of Classification Search
   CPC ..... G06F 3/0659; G06F 3/0619; G06F 3/0673
   See application file for complete search history.

(56) References Cited

U.S. PATENT DOCUMENTS

| 8,238,173 | B2 | 8/2012 | Akerib et al. |
| 10,777,251 | B1 | 9/2020 | Byagowi et al. |
| 11,011,216 | B1 | 5/2021 | Srivastava |
| 11,138,499 | B2 | 10/2021 | Sharma et al. |
| 11,251,186 | B2 | 2/2022 | Sharma et al. |
| 11,657,864 | B1 * | 5/2023 | Lin .................. G11C 11/4097 365/203 |

(Continued)

FOREIGN PATENT DOCUMENTS

DE 102020121214 A1 * 5/2021 ......... G06F 12/0223

(Continued)

OTHER PUBLICATIONS

Chih, et al., "16.4—An 89TOPS/W and 16.3TOPS/mm2 All-Digital SRAM-Based Full-Precision Compute-In Memory Macro in 22nm for Machine-Learning Edge Applications", 2021 IEEE International Solid- State Circuits Conference (ISSCC), San Francisco, California, 2021, 252-254.

(Continued)

*Primary Examiner* — Tim T Vo
*Assistant Examiner* — Janice M. Girouard
(74) *Attorney, Agent, or Firm* — Myers Bigel, P.A.

(57) ABSTRACT

A memory device may include a memory cell array including first to fourth memory cells respectively connected to first to fourth word lines, a sense amplifier including a first sensing circuit that is configured to generate a first weighted sum based on a first weight stored in the first memory cell and a second weight stored in the third memory cell, in response to an activation of the first and third word lines at a first time point, an input and output circuit that is configured to output the first weighted sum to an external device in response to a first read command, and a restore circuit that is configured to perform a restore operation for storing a first data item stored in the second memory cell to the first memory cell and for storing a second data item stored in the fourth memory cell to the third memory cell after the first time point.

20 Claims, 19 Drawing Sheets

(56) References Cited

U.S. PATENT DOCUMENTS

| | | |
|---|---|---|
| 2010/0321980 A1* | 12/2010 | Fujita .................. G11C 13/0007 365/158 |
| 2022/0012016 A1 | 1/2022 | Wang et al. |
| 2022/0222045 A1 | 7/2022 | Song |
| 2022/0358975 A1 | 11/2022 | Son et al. |
| 2022/0366946 A1 | 11/2022 | Jeong et al. |
| 2022/0375508 A1 | 11/2022 | Chang et al. |
| 2024/0013850 A1* | 1/2024 | Wu ........................ G06F 7/4925 |

OTHER PUBLICATIONS

Kim, et al., "Input-Splitting of Large Neural Networks for Power-Efficient Accelerator with Resistive Crossbar Memory Array", 2018 Proceedings of the International Symposium on Low Power Electronics and Design (ISLPED), Bellevue, Washington, 2018, 1-6.

Kwon, et al., "25.4—A 20nm 6GB Function-In-Memory DRAM, Based on HBM2 with a 1.2TFLOPS Programmable Computing Unit Using Bank-Level Parallelism, for Machine Learning Applications", 2021 IEEE International Solid-State Circuits Conference (ISSCC), San Francisco, California, 2021, 350-352.

Lee, et al., "Hardware Architecture and Software Stack for PIM Based on Commercial DRAM Technology—Industrial Product", 2021 ACM/IEEE 48th Annual International Symposium on Computer Architecture (ISCA), Valencia, Spain, 2021, 43-56.

Oh, et al., "Energy-Efficient In-Memory Binary Neural Network Accelerator Design Based on 8T2C SRAM Cell", IEEE Solid-State Circuits Letters, 5, 2022, 70-73.

Yin, et al., "XNOR-SRAM: In-Memory Computing SRAM Macro for Binary/Ternary Deep Neural Networks", IEEE Journal of Solid-State Circuits, 55(6), 2020, 1733-1743.

\* cited by examiner

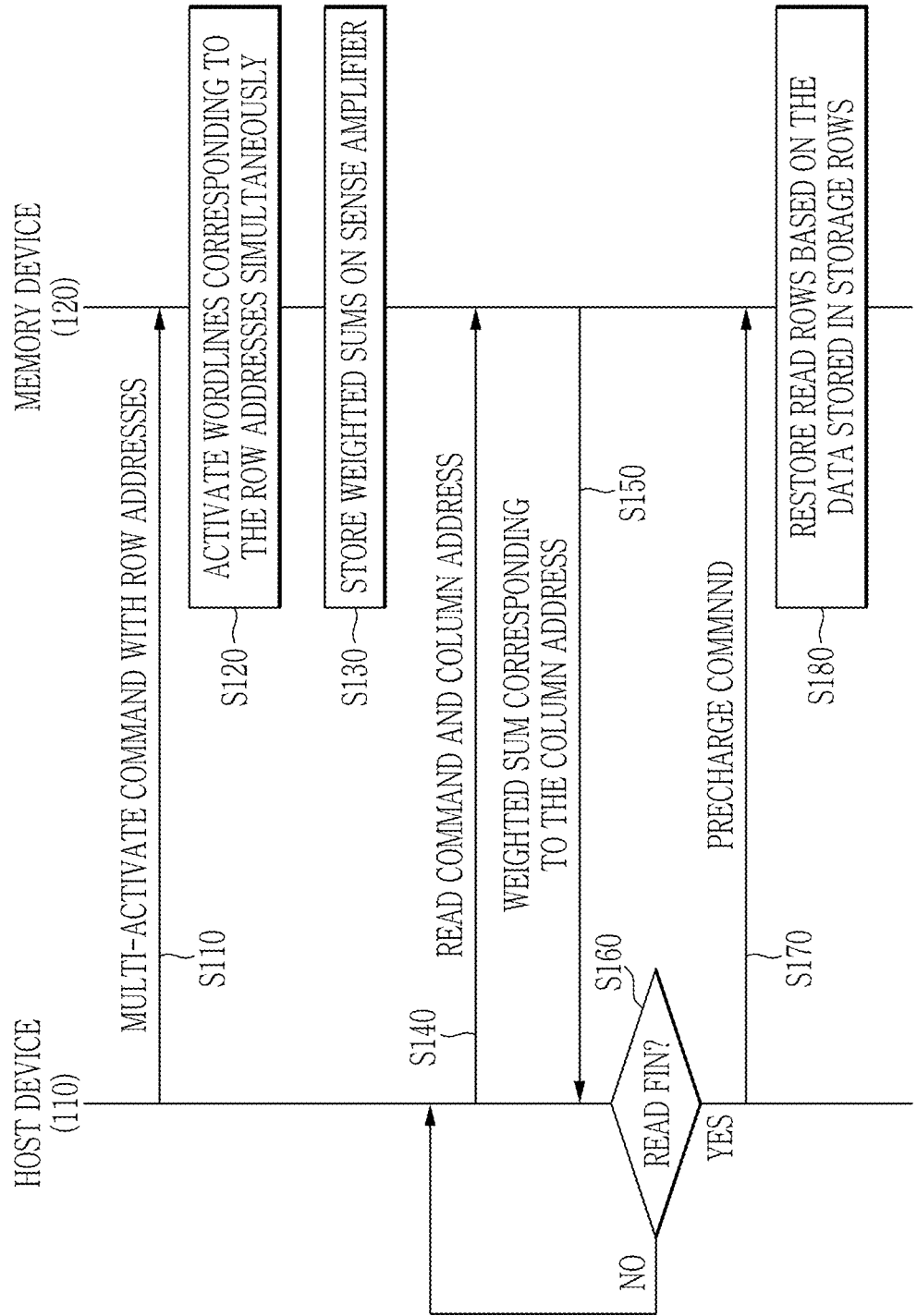

MEMORY DEVICE AND OPERATION METHOD THEREOF

CROSS-REFERENCE TO RELATED APPLICATION

This application claims priority to and the benefit of Korean Patent Application No. 10-2023-0061274 filed on May 11, 2023, in the Korean Intellectual Property Office, the entire contents of which are incorporated herein by reference.

BACKGROUND

(a) Field of the Invention

The present disclosure relates to a semiconductor memory, and more specifically to a memory device and an operation method thereof.

(b) Description of the Related Art

In general, an operation speed of a memory device and an operation speed of a processor are faster than a communication speed between the processor and the memory device. With a development of artificial intelligence technology, various technologies are being researched to solve a bottleneck caused by such communication speed. For example, in recent years, a process-in-memory (PIM) technology in which a memory device performs some arithmetic operations has been researched.

Dynamic random access memory (DRAM) devices are widely used as a main memory of processors. The DRAM devices store data in a form of charge stored in memory cells. However, the charge stored in the memory cell of the DRAM device may leak as a read operations are performed. Therefore, when a read operation is performed on a memory cell of a DRAM, a restore operation to restore the leaked charge may be performed.

SUMMARY

Embodiments of the present disclosure may provide a memory device that performs arithmetic operations and an operation method thereof.

A memory device according to an embodiment of the present disclosure may include a memory cell array including first to fourth memory cells respectively connected to first to fourth word lines, a sense amplifier including a first sensing circuit configured to generate a first weighted sum based on a first weight stored in the first memory cell and a second weight stored in the third memory cell, in response to an activation of the first and third word lines at a first time point, an input and output circuit configured to output the first weighted sum to an external device in response to a first read command, and a restore circuit configured to perform a restore operation for storing a first data item stored in the second memory cell to the first memory cell and for storing a second data item stored in the fourth memory cell to the third memory cell after the first time point.

An operation method of a memory device including a memory cell array including a plurality of memory cell rows respectively connected to a plurality of word lines, and a sense amplifier connected to the memory cell array through a plurality of bit lines, comprising, activating a first word line connected to a first memory cell row and a second word line connected to a second memory cell row, storing a first data item stored in a third memory cell row to the sense amplifier by activating a third word line connected to the third memory cell row, storing the first data item respectively in the first memory cell row and the third memory cell row, by activating the first word line and the third word line, storing a second data item stored in a fourth memory cell row in the sense amplifier, by activating a fourth word line connected to the fourth memory cell row, and storing the second data item respectively in the second memory cell row and the fourth memory cell row, by activating the second word line and the fourth word line.

An operation method of a memory system comprising a memory device and a host device, wherein the memory device includes a first plurality of memory cells connected to a first plurality of word lines and a second plurality of memory cells connected to a second plurality of word lines, comprising, providing, by the host device, a multi-activate command to the memory device, activating, by the memory device, the first plurality of word lines in response to the multi-activate command, and performing, by the memory device, a restore operation for the first plurality of memory cells based on the second plurality of memory cells after the first plurality of word lines are activated.

BRIEF DESCRIPTION OF THE DRAWINGS

FIG. 10 is a flowchart showing an operation of a memory system according to an embodiment of FIG. 9.

DETAILED DESCRIPTION

Figure 1:
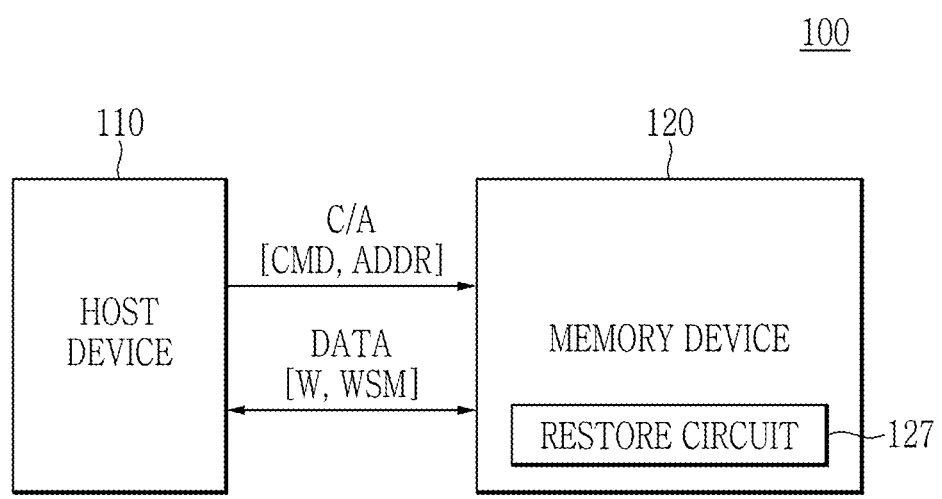
FIG. 1 is a block diagram illustrating a memory system according to an embodiment of the present disclosure.

Hereinafter, embodiments of present disclosure will be described clearly and in detail to the extent that a person of an ordinary skill in the technical field of present disclosure can easily practice present disclosure. Details such as detailed configurations and structures are provided merely to facilitate an overall understanding of the embodiments of the present disclosure. Therefore, variations of the embodiments described in the text may be performed by a person of an ordinary skill in the art without departing from the technical spirit and range of the present disclosure. Moreover, descriptions of well-known functions and structures are omitted for clarity and conciseness. Components in the following drawings or detailed description may be connected to other elements other than the constituent elements shown in the drawing or described in the detailed description. The terms used in this text are terms defined in consideration of the functions of present disclosure, and are not limited to specific functions. The definition of terms may be determined based on the details described in the detailed description. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

Constituent elements described with reference to terms such as driver (driver) or block (block) used in the detailed description may be implemented in the form of software, hardware, or a combination thereof. Illustratively, software may be machine code, firmware, embedded code, and/or application software. For example, the hardware may include an electric circuit, an electronic circuit, a processor, a computer, integrated circuit cores, a pressure sensor, an inertial sensor, a Micro Electro Mechanical System (MEMS), a passive element, or a combination thereof.

FIG. 1 is a block diagram illustrating a memory system according to an embodiment of the present disclosure. Referring to FIG. 1, a memory system 100 may include a host device 110 and a memory device 120.

In an embodiment, the host device 110 may be one of various types of processors, such as a central processing unit (CPU) or graphic processing unit (GPU).

Hereinafter, for a more concise description, it is assumed that the memory device 120 is a dynamic random access memory (DRAM), and the host device 110 and the memory device 120 communicate with each other based on a double data rate (DDR) interface. However, the embodiments of the present disclosure are not limited thereto. For example, the host device 110 and the memory device 120 may communicate with each other based on a Low Power Double Data Rate (LPDDR) interface.

The host device 110 may store a data item DATA in the memory device 120 or read a data DATA from the memory device 120. For example, the host device 110 may control the memory device 120 by transmitting various types of commands and addresses to the memory device 120 through command/address signals C/A.

In an embodiment, the command/address signals C/A may represent a command (CMD) and an address (ADDR) information. For example, the command/address signals C/A may represent a read command, a write command, and/or a multi-activate command. The command/address signals C/A may represent one or more bank addresses, row addresses, or column addresses. However, the embodiments of the present disclosure are not limited thereto, and the command/address signals C/A may indicate various types of commands and addresses.

The memory device 120 may include a plurality of memory cells. A plurality of memory cells may be connected to a plurality of word lines and a plurality of bit lines.

The memory device 120 may store a plurality of weights (W; weight) received from the host device 110 in a plurality of memory cells in response to a write command from the host device 110.

The memory device 120 may perform a multiply and accumulate (MAC) calculation based on a plurality of weights W in response to a multi-activate command from the host device 110. For example, the memory device 120 may receive a multi-activate command and row addresses from the host device 110. In this case, the memory device 120 may calculate weighted sums WSM in response to the multi-activate command, based on weights stored in a plurality of memory cells corresponding to the row addresses. A detailed method according to some embodiments for the memory device 120 to calculate the weighted sums WSM will be described in detail with reference to the drawings below.

The memory device 120 may output the weighted sum WSM to the host device 110 in response to a read command from the host device 110. That is, according to an embodiment of the present disclosure, the memory device 120 may output the weighted sum WSM calculated based on the plurality of weight W in response to the control of the host device 110. In this case, a number of times of the host device 110 accesses the memory device 120 to calculate weighted sums WSM may be reduced or minimized. Accordingly, because a bottleneck caused by the communication speed between the host device 110 and the memory device 120 may be reduced or minimized, the operation speed of the memory system 100 may be improved.

In an embodiment, the multi-activate command may be a command to activate a plurality of word lines of the memory device 120. That is, according to an embodiment of the present disclosure, a plurality of word lines of the memory device 120 may be simultaneously activated or activated in concert with one another.

In an embodiment, the memory device 120 may include a restore circuit 127. The restore circuit 127 may control various elements of the memory device 120 to restore a data stored in the memory cells connected to the plurality of activated word lines. The specific functions and operation of the restore circuit 127 will be described in detail with reference to the drawings below.

Figure 2:
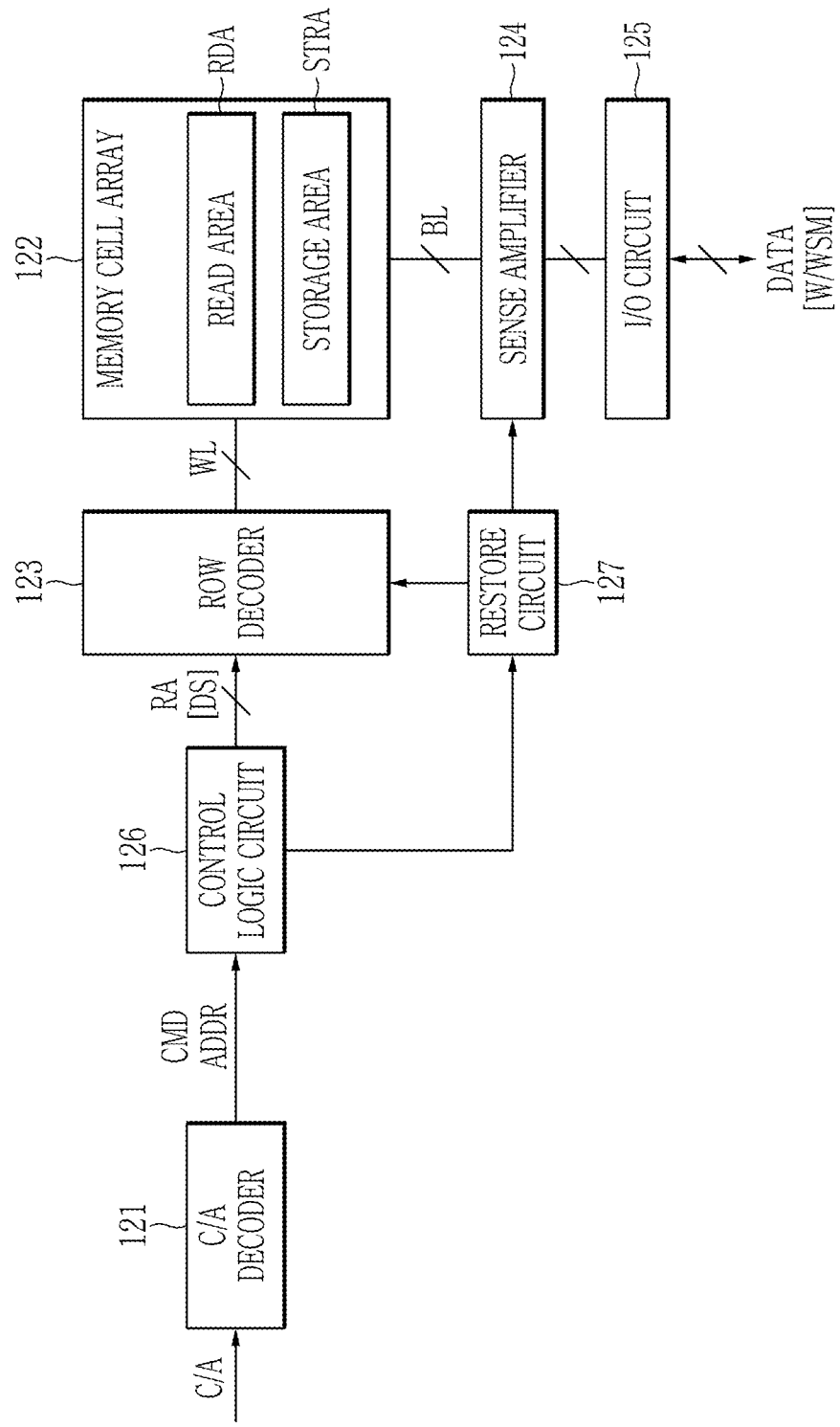
FIG. 2 is a block diagram illustrating a memory device in FIG. 1 in more detail.

FIG. 2 is a block diagram illustrating a memory device in FIG. 1 in more detail. Referring to FIG. 2, the memory device 120 may include a command/address decoder (121; C/A decoder), a memory cell array 122, a row decoder 123, a sense amplifier 124, an input and output circuit (125; I/O circuit), a control logic circuit 126, and a restore circuit 127.

The command/address decoder 121 may receive command/address signals C/A provided from the host device 110. The command/address decoder 121 may decode the command/address signals C/A into a command CMD and an address ADDR. In this case, the address ADDR may include a bank address, a row address RA, and/or a column address.

The memory cell array 122 may include a read area RDA and a storage area STRA. Each of the read area RDA and storage area STRA may include a plurality of memory cells arranged in a row direction and a column direction. The plurality of memory cells may be connected to a plurality of word lines WL extending in a row direction and a plurality of bit lines BL extending in a column direction.

In an embodiment, the read area RDA and the storage area STRA may be connected to different word lines from each other, and may be connected to the same bit lines. That is, the read area RDA and the storage area STRA may be arranged in different rows of the memory cell array 122. The specific implementation method of the read area RDA and the storage area STRA is described with reference to FIG. 3.

In an embodiment, the memory cells included in the read area RDA may store weights to be used in a MAC calculation.

In an embodiment, memory cells included in the storage area STRA may store data (e.g., weights) to be used for a restore operation for the read area RDA. For example, the memory cells included in the storage area STRA may store the same data as the memory cells included in the read area RDA. However, the embodiments of present disclosure are not limited thereto.

The row decoder 123 may control a plurality of word lines WL based on the row address RA. For example, the row decoder 123 may activate some of the plurality of word lines WL based on the row address RA.

In an embodiment, the row decoder 123 may activate some word lines connected to the read area RDA based on the row address RA received along with a multi-activate command.

The sense amplifier 124 may be connected to the memory cell array 122 through a plurality of bit lines BL. The sense amplifier 124 may temporarily store a data item provided from the memory cell array 122. For example, the sense amplifier 124 may store the data item stored in the memory cell connected to an activated word line.

In an embodiment, the sense amplifier 124 may generate a weighted sum WSM based on the data of the memory cells connected to the activated plurality of word lines. That is, the sense amplifier 124 may generate the weighted sum WSM in response to the multi-activate command. The specific operation in which the sense amplifier 124 generates the weighted sum WSM is described with reference to FIG. 4 below in more detail.

The I/O circuit 125 may receive data DATA from the host device 110 or transmit data DATA to the host device 110. For example, the I/O circuit 125 may provide weights W received from the host device 110, to a write driver (not shown) to be written to the memory cell array 122, or may output the weighted sums WSM generated by the sense amplifier 124 to the host device 110.

The control logic circuit 126 may receive the command CMD and the address ADDR. The control logic circuit 126 may control the operation of each constituent element of the memory device 120 based on the command CMD and the address ADDR. For example, the control logic circuit 126 may control the row decoder 123 through the row address RA.

In an embodiment, the control logic circuit 126 may provide a plurality of row addresses RAs to the row decoder 123 in response to the multi-activate command. In this case, a plurality of row addresses RAs may correspond to domain signals DS. The domain signals DS may represent values to be used in an arithmetic operation (i.e., MAC calculation) with the weights W. For example, the weighted sums WSM can be determined through MAC calculation of domain signals DS and weights W. For example, the weighted sums WSM may be determined through the MAC calculation of the domain signals DS and the weights W. That is, according to an embodiment of the present disclosure, the host device 110 may indicate the domain signals DS to be MAC calculated with the weights W in the form of the row address. The MAC calculation for the domain signal DS and the weights W is described with reference to FIG. 4 in more detail.

The restore circuit 127 may restore the data stored in the memory cells included in the read area RDA based on the data stored in the memory cells included in the storage area STRA.

In an embodiment, the restore circuit 127 may store the data of the memory cells connected to the first word line (e.g., which included in the memory cells of the storage area STRA) in the sense amplifier 124 by controlling the row decoder 123. After that, the restore circuit 127 may control the row decoder 123 to activate both of the second word line connected to the read area RDA and the first word line. In this case, the data stored in the sense amplifier 124 may be restored to the memory cells connected to the second word line (i.e., which included in the read area RDA). In this way, the restore circuit 127 may restore the data stored in the memory cells of the read area RDA. However, the embodiments of present disclosure are not limited to this example, and the restore circuit 127 may restore the data stored in the memory cells of the read area RDA by the method of simultaneously or in concert with one another activating the word lines connected to the read area RDR and the word lines connected to the storage area STRA. The specific operation of the memory device 120 according to the control of the restore circuit 127 will be described in detail with reference to the drawings below.

Figure 3:
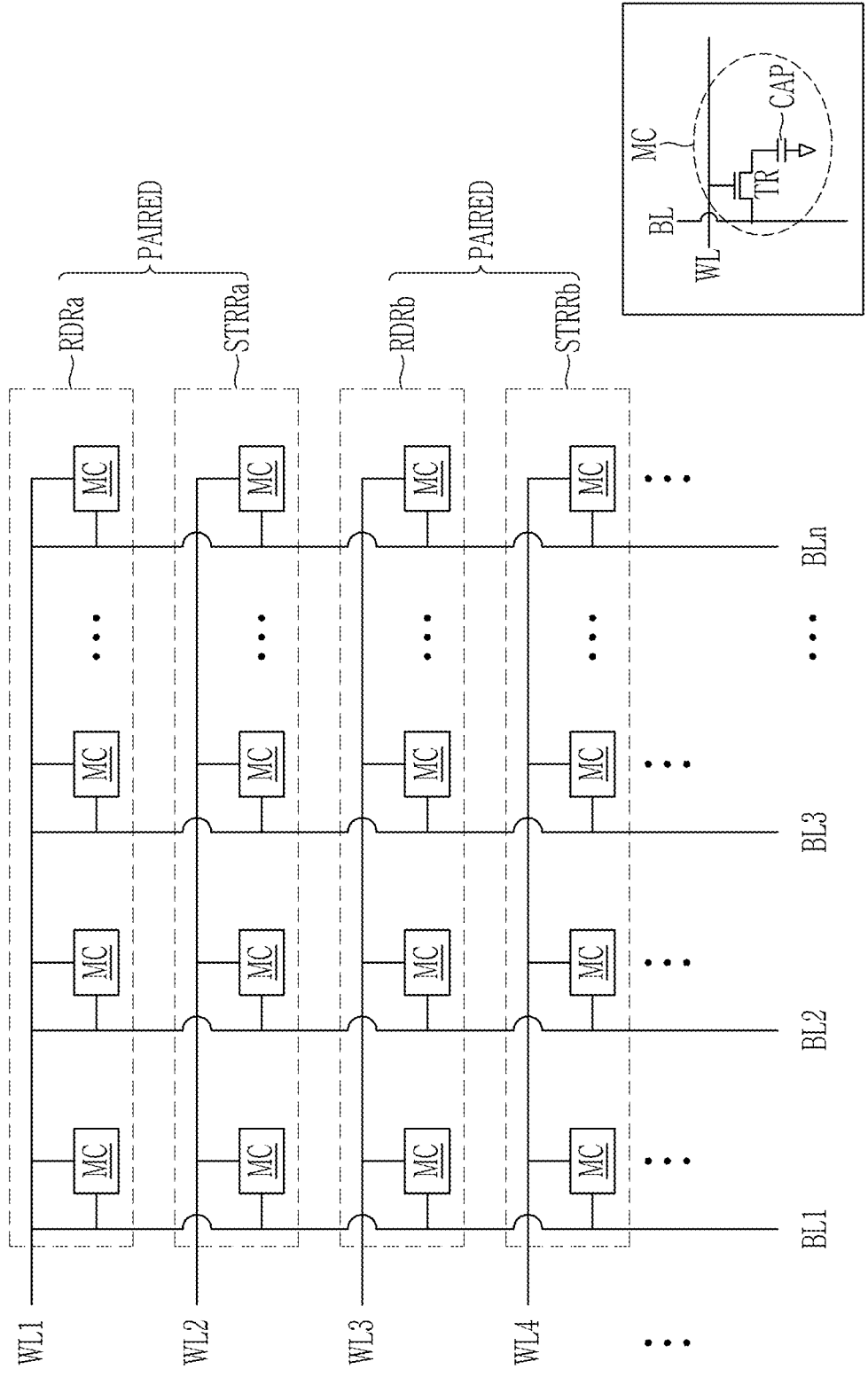
FIG. 3 is a block diagram illustrating a memory cell array of FIG. 2 in more detail.

FIG. 3 is a block diagram showing a memory cell array in FIG. 2 in more detail. Referring to FIG. 1 to FIG. 3, the memory cell array 122 may include a plurality of memory cells MC. A plurality of memory cells MC may be arranged in a row direction and a column direction to form a matrix structure. For more concise description below, the memory cells arranged in the same row of the memory cell array 122 is referred to as 'a memory cell row'.

A plurality of memory cells MC may be connected to a plurality of word lines WL. For a more concise explanation, in FIG. 3, the memory cells connected to the first to fourth word lines WL1 to WL4 are representatively shown, but the embodiments of present disclosure are not limited thereto. For example, the embodiments of present disclosure are not limited to the number of the word lines and the number of the memory cells.

The read area RDA may include a plurality of memory cell rows. Hereinafter, for a more concise description, the memory cell row included in the read area RDA is referred to as a read row RDR.

In an embodiment, the read area RDA may include the memory cell rows connected to the odd numbered word lines of the memory cell array 122. For example, the read area RDA may include a first read row RDRa connected to the first word line WL1 and a second read row RDRb connected to the third word lines WL3.

The storage area STRA may include a plurality of memory cell rows. Hereinafter, for more concise description, the memory cell row included in storage area STRA is referred to as a storage row STRR.

In an embodiment, the storage area STRA may include the memory cell rows connected to the even numbered word lines of the memory cell array 122. For example, the storage area STRA may include a first storage row STRRa connected to the second word line WL2 and a second storage row STRRb connected to the fourth word line WLA.

For a more concise explanation, an embodiment in which the memory cell rows connected to the odd numbered word lines of the memory cell array 122 are the read row RDR, and the memory cell rows connected to the even numbered word lines are the storage row STRR is representatively described. However, the embodiments of the present disclosure are not limited to the arrangement of the read row RDR and the storage row STRR on the memory cell array 122. For example, the memory cell rows (e.g., the memory cell rows disposed away from the sense amplifier 124) disposed at the top of the memory cell array 122 may be a read row RDR, and the memory cell rows (e.g., the memory cell rows disposed adjacent to the sense amplifier 124) disposed at the bottom of the memory cell array 122 may be a storage row STRR.

The plurality of read rows RDR and the plurality of storage rows STRR may be paired with each other. For example, the first read row RDRa may be paired with the first storage row STRRa, and the second read row RDRb may be paired with the second storage row STRRb.

In an embodiment, the paired read row and storage row may be connected with the word lines that are adjacent to each other. However, the embodiments of present disclosure are not limited thereto.

Each of the plurality of storage rows STRR may store the same data (i.e., the weight) as the paired read row. For example, the first storage row STRRa may store the same data as the first read row RDRa, and the second storage row STRRb may store the same data as the second read row RDRb. In this case, each of the plurality of storage row STRRs may be used for the restore operation of the paired read row. The restore operation for the read rows using the paired storage rows is described with reference to FIG. 5A and FIG. 5B below in more detail.

The plurality of memory cells MC may be connected to the plurality of bit lines BL. For example, the plurality of memory cells MC may be connected to the first to n-th bit lines BL1-BLn.

Each of the plurality of memory cells MC may be a DRAM cell. For example, each of the plurality of memory cells MC may include a transistor TR and a capacitor CAP, and may store the data based on the level of the charge stored in the capacitor CAP.

In an embodiment, the memory cells MC may store the weights W in binary format. For example, if the capacitor CAP of the memory cells MC is charged with the charge, it may be referred to as storing weight '1', and if the capacitor CAP is not charged, it may be referred to as storing weight '0'. However, the embodiments of present disclosure are not limited thereto.

In an embodiment, the memory cell included in a read row may be referred to as a read cell.

In an embodiment, the memory cell included in a storage row may be referred to as a storage cell.

In an embodiment, the activated word line may be referred to as an 'active word line'.

Figure 4:
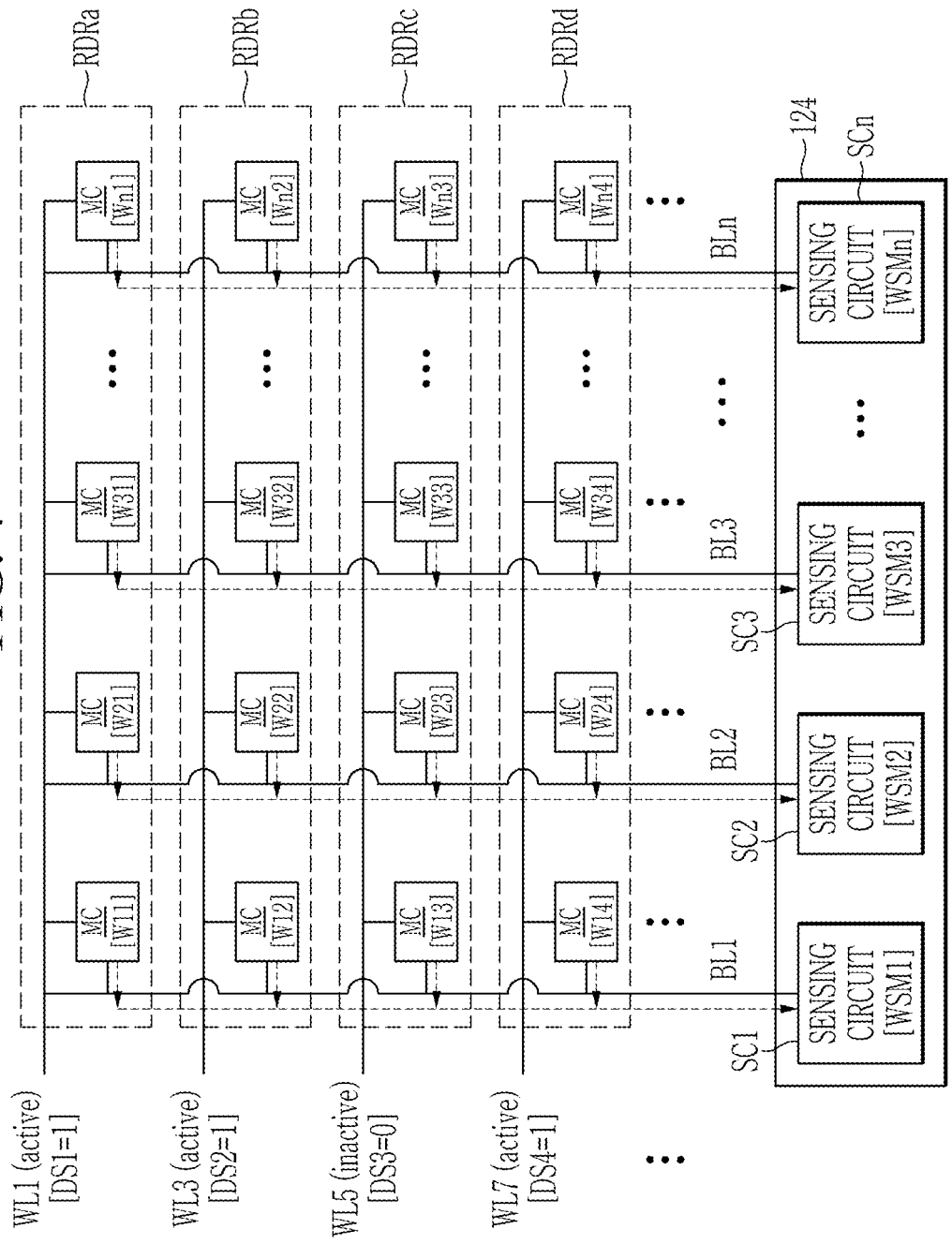
FIG. 4 shows a multiply and accumulate (MAC) operation performed by a memory device of FIG. 2.

FIG. 4 shows a MAC calculation performed by a memory device of FIG. 2. Referring to FIG. 1 to FIG. 4, the memory cells included in the different read rows next to each other may store the different weights from each other. For example, the memory cells included in the first read row RDRa (i.e., the memory cell rows connected to the first word line WL1) may store weights W11 to Wn1, respectively; and the memory cells included in the second read row RDRb (i.e., the memory cell rows connected to the third word line WL3) may store weights W12 to Wn2, respectively.

The host device 110 may control the memory device 120 to perform the MAC calculation by transmitting the multi-activate command. For example, the host device 110 may provide the multi-activate command and a plurality of row addresses RA to the memory device 120.

The memory device 120 may activate some word lines connected to the read rows RDR in response to the plurality of row addresses provided with the multi-activate command. That is, the row decoder 123 may activate word lines corresponding to the plurality of row addresses RA. For example, when the row addresses which correspond to the first word line WL1, the third word line WL3, and the seventh word line WL7 are received, the row decoder 123 may activate the first word line WL1, the third word line WL3, and the seventh word line WL7. On the other hand, if the row address corresponding to the fifth word line WL5 is not included in the received row addresses, the row decoder 123 may not activate the fifth word line WL5.

In an embodiment, the memory device 120 may not activate the word line connected to the storage rows STRR in response to the multi-activate command. That is, while the MAC operation is being performed, the word lines connected to the storage rows STRR may not be activated. In this case, charge stored in memory cells of storage rows STRR may be not leaked.

In an embodiment, the host device 110 may determine the domain signals DS to be MAC calculated based on the row addresses to be provided with the multi-activate command. For example, the host device 110 may determine the first domain signal DS1 as '1', by providing the row address of the word line connected to the first read row RDRa (i.e., the first word line WL1) with the multi-activate command. Similarly, the host device 110 may determine the second domain signal DS2 as '1', by providing the row address of the word line connected to the second read row RDRb (i.e., the third word line WL3) with the multi-activate command. On the other hand, the host device 110 may determine the third domain signal DS3 as '0', by providing the row address of the word line connected to the third read row RDRc (i.e., the fifth word line WL5) with the multi-activate command. That is, according to an embodiment of present disclosure, when the multi-activate command is received, whether the first read row RDRa is activated may indicate the first domain signal DS1; whether the second read row RDRb is activated may indicate the second domain signal DS2; and whether the third read row RDRc is activated may indicate the third domain signal DS3.

The sense amplifier 124 may include first to n-th sensing circuits SC1-SCn. The first to n-th sensing circuits SC1 to SCn may be connected to the first to n-th bit lines BL1 to BLn. For example, the first sensing circuit SC1 may be connected to the first bit line BL1, and the second sensing circuit SC2 may be connected to the second bit line BL2.

Each of the first to n-th sensing circuits SC1 to SCn may calculate the weighted sum based on the weights stored in the memory cells connected to the corresponding bit lines. For example, the first to n-th sensing circuits SC1 to SCn may respectively calculate the first to n-th weighted sums WSM1 to WSMn. Hereinafter, for a more concise description, a method in which the first sensing circuit SC1 calculates the weighted sum will be representatively described. Because the method in which the second to n-th sensing circuits SC2 to SCn calculate the weighted sum is similar thereto, the detailed description will be omitted.

The first sensing circuit SC1 may calculate the first weighted sum WSM1 based on the changed voltage level of the first bit line BL1. The size of the first weighted sum WSM1 may be determined as in Equation 1 below.

$$\sum_{k=1}^{M} DSk \times W_{1k} \qquad \text{[Equation 1]}$$

In an embodiment, DSk may indicate a value of a k-th domain signal, $W_{1k}$ may indicate the weight stored in the memory cell disposed in the first row and k-th column of the memory cell array 122, and M may indicate the number of the read rows RDR included in the memory cell array 122.

The first sensing circuit SC1 may calculate the first weighted sum WSM1 by sensing the voltage level of the first bit line BL1 that varies based on the activated word lines. For example, if the first, third, and seventh word lines WL1, WL3, and WL7 are activated, the voltage level of the first bit line BL1 may be changed according to the sum of the weights 'W11', 'W12', and 'W14'. On the other hand, if the fifth word line WL5 is not activated, the voltage level of the first bit line BL1 may be changed regardless of the weight 'W13'. In this case, the voltage level change sensed by the first sensing circuit SC1 may correspond to the sum of W11, W12, and W14. In this way, the first sensing circuit SC1 may be able to calculate the first weighted sum WSM1.

Accordingly, the memory device 120 according to the present disclosure may calculate the weighted sum in response to the multi-activate command received from the host device 110. In this case, since the data movement between the host device 110 and the memory device 120 may be reduced or minimized, the operation speed of the memory system 100 may be improved.

Also, according to an embodiment of the present disclosure, the weighted sum may be calculated only with the configuration of the memory cells MC themselves without coupling a neural processing unit (NPU) to the memory cell array 122. Therefore, according to the embodiment of the present disclosure, a memory device 120 satisfying "Cell-Level-Parallelism" may be provided.

In an embodiment, the memory cells connected to the different bit lines may store the different weights. In this case, even if the multi-activate command is issued once from the host device 110, the sensing circuits connected to the different bit lines for the same domain signals DS may calculate the weighted sums based on the different weights. That is, each of the sensing circuits according to the embodiment of the present disclosure may operate as PE (processing element).

In an embodiment, when the weights to be used for a MAC operation are multi-bit, each of the sensing circuits connected to the different bit lines may perform the MAC operation for different place values of multi-bit weights. In this case, each of the weights W stored in the memory cells MC of FIG. 4 may be one of the bits of the weight to be used for MAC operation. For example, if the weights to be used for MAC operation are 2-bit, the memory cells connected to the first bit line BL1 may store the most significant bit (MSB) of the weights, and the memory cells connected to the second bit line BL2 may store the least significant bit (LSB) of the weights. In this case, the first sensing circuit SC1 may be able to calculate the weighted sum for the MSB of weight and for the domain signals DS; and the second sensing circuit SC2 may be able to calculate the weighted sum for the least significant bit LSB of weight and the domain signals DS. However, the embodiments of present disclosure are not limited thereto.

In an embodiment, when the domain signals to be used for MAC operation are the multi-bit, the host device 110 may sequentially provide a plurality of multi-activate commands to the memory device 120. The memory device 120 may perform MAC operations corresponding to the different place values of the multi-bit domain signal, in response to a plurality of multi-activate commands. In this case, each of the domain signals DS of FIG. 4 may be one of the bits of multi-bit domain signals to be used for a MAC operation. For example, if the domain signals to be used for the MAC operation are 2-bit, the host device 110 may issue the row addresses corresponding to the MSB of the multi-bit domain signals with a first multi-activate command, and may issue the row addresses corresponding to the LSB of the multi-bit domain signals with second multi-activate command. In this case, the memory device 120 may calculate the weighted sum for the MSB of the domain signal in response to the first multi-activate command, and calculate the weighted sum for the LSB of the domain signal in response to the second multi-activate command. However, the embodiments of the present disclosure are not limited thereto.

Each of the first to n-th sensing circuits SC1 to SCn may temporarily store the calculated weighted sum. Each of the first to n-th sensing circuits SC1 to SCn may provide the stored weighted sum to the I/O circuit 125, in response to a read command issued from the host device 110.

In an embodiment, when the word lines connected to the plurality of read rows are simultaneously activated or activated in concert with each other, the data stored in the sense amplifier 124 may be different from the data stored in each of the plurality of memory cells. For example, each of the first to n-th weighted sums WSM1 to WSMn stored in the sense amplifier 124 may be different from the weights W11 to Wn1 stored in the first read row RDRa. In this case, it may be difficult to perform the restore operation for each read row RDR through the data stored in the sense amplifier 124 in response to the multi-activate command. Hereinafter, a method of performing a restore operation on the plurality of read rows after the word lines connected to the plurality of read rows have been simultaneously activated or activated in concert with each other will be described in detail.

In an embodiment, each of the first to nth sensing circuits SC1 to SCn may determine a weighted sum by comparing the voltage level of the connected bit line with the precharge voltage. However, the embodiments of the present disclosure are not limited to the specific operation method of the first to n-th sensing circuits SC1 to SCn.

In an embodiment, the number of the memory cell rows included in the read area RDA may be determined based on the capacitances of the first to n-th sensing circuits SC1 to SCn. For example, the number of the memory cell rows included in the read area RDA may be determined based on the voltage level of the bit line that can be sensed by each of the first to n-th sensing circuits SC1 to SCn. As a more detailed example, if each of the first to n-th sensing circuits SC1 to SCn can sense the voltage level transition of the bit line that changes in response to turning on '4' memory cells simultaneously or in concert with each other, the number of the memory cell rows included in the read area RDA may be '4'. In this case, the memory cell array 122 is a plurality of read areas, but the embodiments of present disclosure are not limited thereto.

Figure 5A:
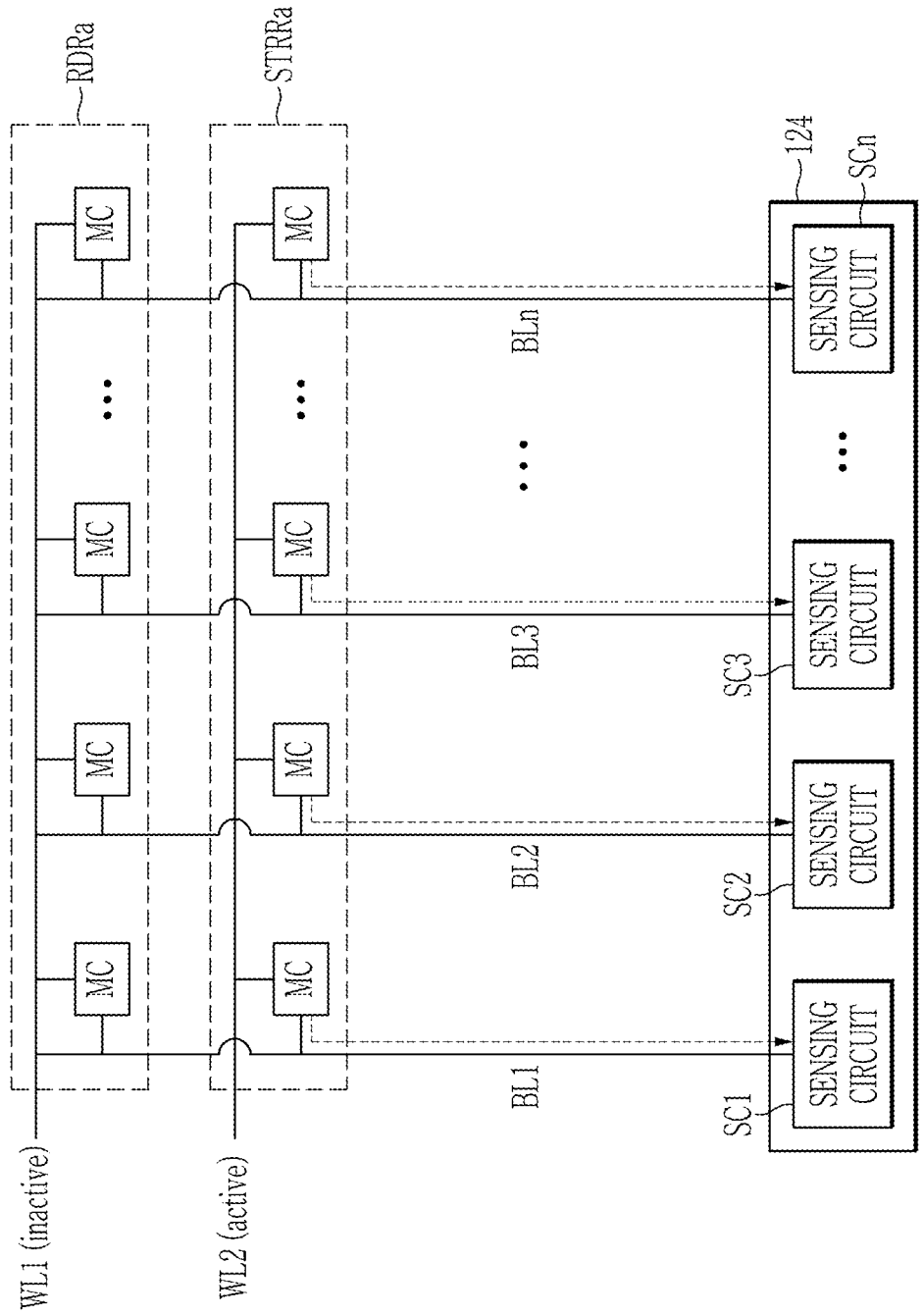
FIG. 5A and FIG. 5B illustrate a restore operation according to an embodiment of the present disclosure.
Figure 5B:
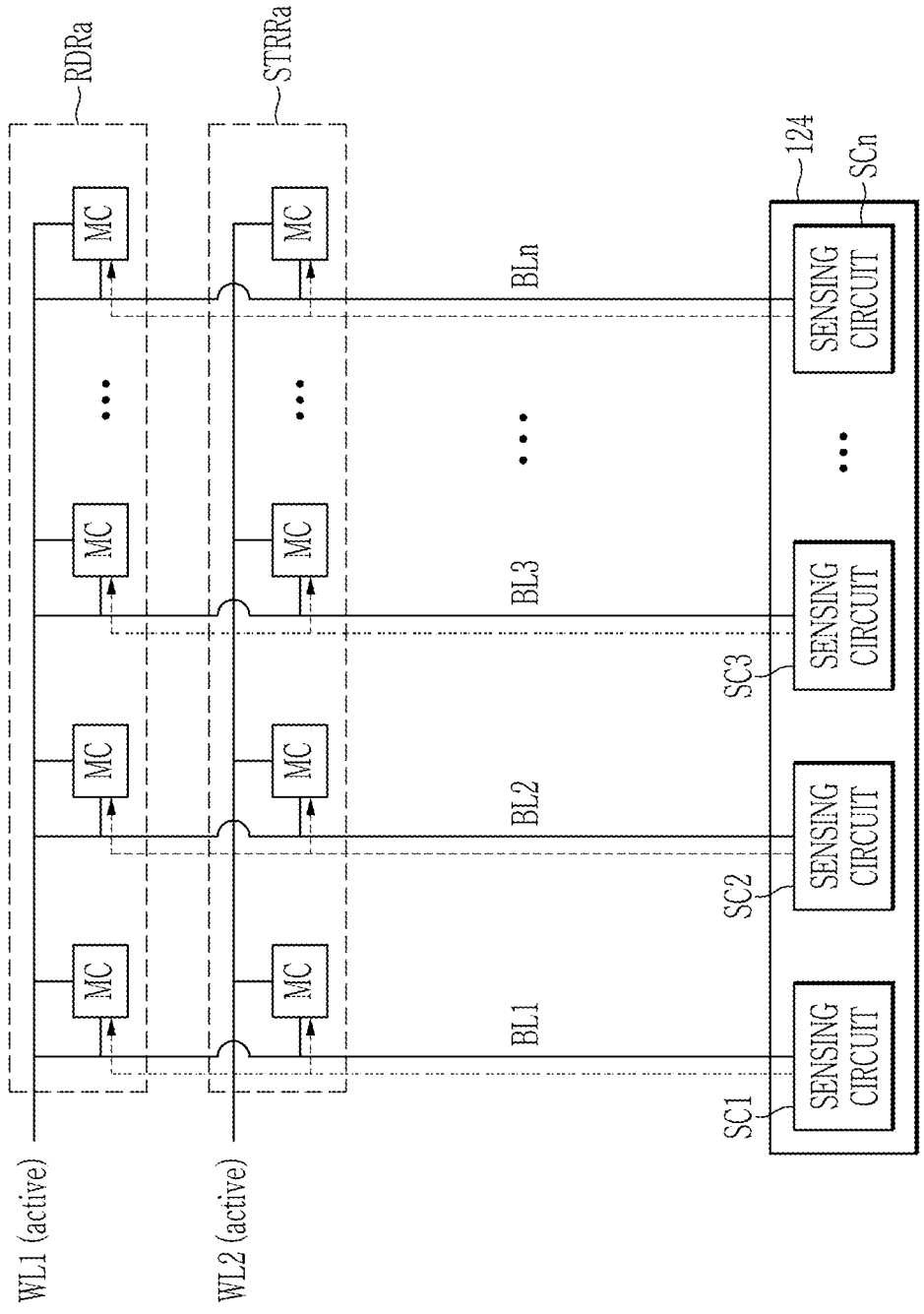

FIG. 5A and FIG. 5B illustrate a restore operation according to an embodiment of the present disclosure. In the following, the first read row RDRa will be representatively described with reference to FIG. 5A and FIG. 5B.

First, referring to FIG. 5A together FIG. 1 to FIG. 4, the word line connected to the storage row (i.e., the first storage row STRRa paired to the first read row RDRa) may be activated. For example, the restore circuit 127 may control the row decoder 123 to activate the second word line WL2.

When the second word line WL2 is activated, the data stored in the first storage row STRRa may be stored in the sense amplifier. For example, the data item stored in the memory cell connected to the first bit line BL1, among the memory cells included in the first storage row STRRa, may be stored in the first sensing circuit SC1. Similarly, the data item stored in the memory cell connected to the second bit line BL2, among the memory cells included in the first storage row STRRa, may be stored in the second sensing circuit SC2.

Next, referring to FIG. 1 to FIG. 4, and FIG. 5A to FIG. 5B, the first read row RDRa and the word line connected to the storage row paired thereto (i.e., first storage row STRRa) may be activated. For example, the restore circuit 127 may control the row decoder 123 to activate the first and second word lines WL1 and WL2.

When the first and second word lines WL1 and WL2 are activated after the data item of the first storage row STRRa is stored in the sense amplifier 124, the data item stored in the sense amplifier 124 may be stored to the first read row RDRa and the first storage row STRRa. For example, the data item stored in the first sensing circuit SC1 (i.e., the data item stored in the memory cell connected to the second word line WL2 and the first bit line BL1) may be stored to the memory cells of the first read row RDRa and the first storage row STRRa, which are connected to the first bit line BL1. Similarly, the data item stored in the second sensing circuit SC2 may be stored in the memory cells of the first read row RDRa and the first storage row STRRa, which are connected to the second bit line BL2.

In an embodiment, the data stored in the first storage row STRRa may be the same as the data stored in the first read row RDRa. Therefore, the restore operation for the first read row RDRa may be normally performed through the described restore operation referring to FIG. 5A and FIG. 5B. That is, according to an embodiment of the present disclosure, even if the word lines connected to the plurality of read rows are simultaneously activated or activated in concert with each other, the restore operation for the memory cells included in the plurality of read rows may be normally performed.

In an embodiment, the restore operation may be performed before the memory device 120 enters an idle state. For example, the restore operation may be performed before the precharge operation for the first to n-th bit lines BL1 to BLn is performed. However, the embodiments of the present disclosure are not limited thereto.

Figure 6:
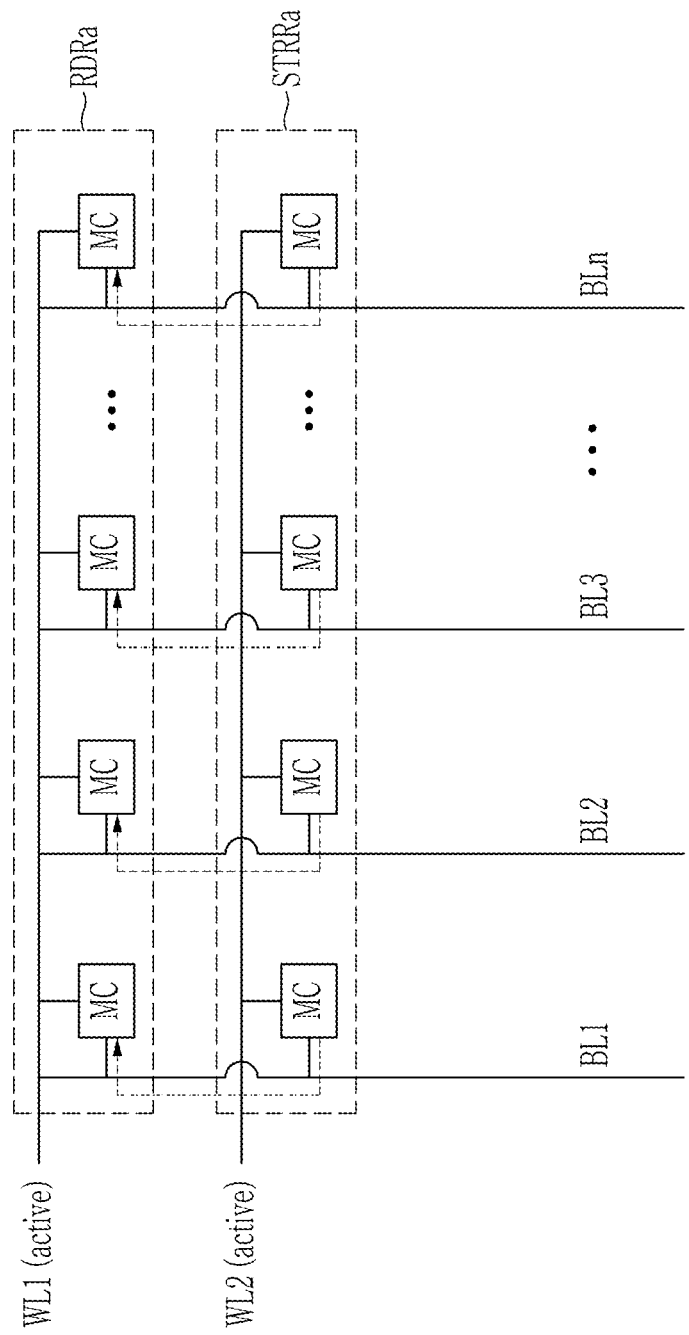
FIG. 6 illustrates a restore operation according to another embodiment of the present disclosure.

FIG. 6 shows a restore operation according to another embodiment of the present disclosure. In the following, the restore operation for the first read row RDRa will be described as a representative example with reference to FIG. 6.

Referring to FIG. 1 to FIG. 4, and FIG. 6, the word lines connected to the first read row RDRa and the first storage row STRRa may be simultaneously activated or activated in concert with one another. For example, the restore circuit 127 may control the row decoder 123 to simultaneously activate the first and second word lines WL1 and WL2 or activate the first and second word lines WL1 and WL2 in concert with one another.

When the first and second word lines WL1 and WL2 are activated simultaneously or in concert with one another, the data stored in the memory cells of the first storage row STRRa may be restored to the first read row RDRa. For example, the charge stored in the memory cell connected to the first storage row STRRa and the first bit line BL1 may be moved to the memory cell connected to the first read row RDRa and the first bit line BL1. In other embodiments, the charge of the memory cell connected to the first read row RDRa and the first bit line BL1 may be moved to the memory cell connected to the first storage row STRRa and the first bit line BL1. In this case, the data item of the memory cell connected to the first read row RDRa and the first bit line BL1 may be restored based on the charge of the memory cell connected to the first storage row STRRa and the first bit line BL1.

In an embodiment, the amount of the charge of a read cell, which is restored through the embodiment of FIG. 6 may have a size between the amount of the charge stored in the read cell before the MAC operation being performed and the amount of the charge stored in the read cell after the MAC operation being performed.

That is, according to the embodiment of the present disclosure, the memory cells of the read row 'read destructively' through the MAC operation may be restored based on the storage cells that store the same data as the read row before performing the MAC operation.

Figure 7:
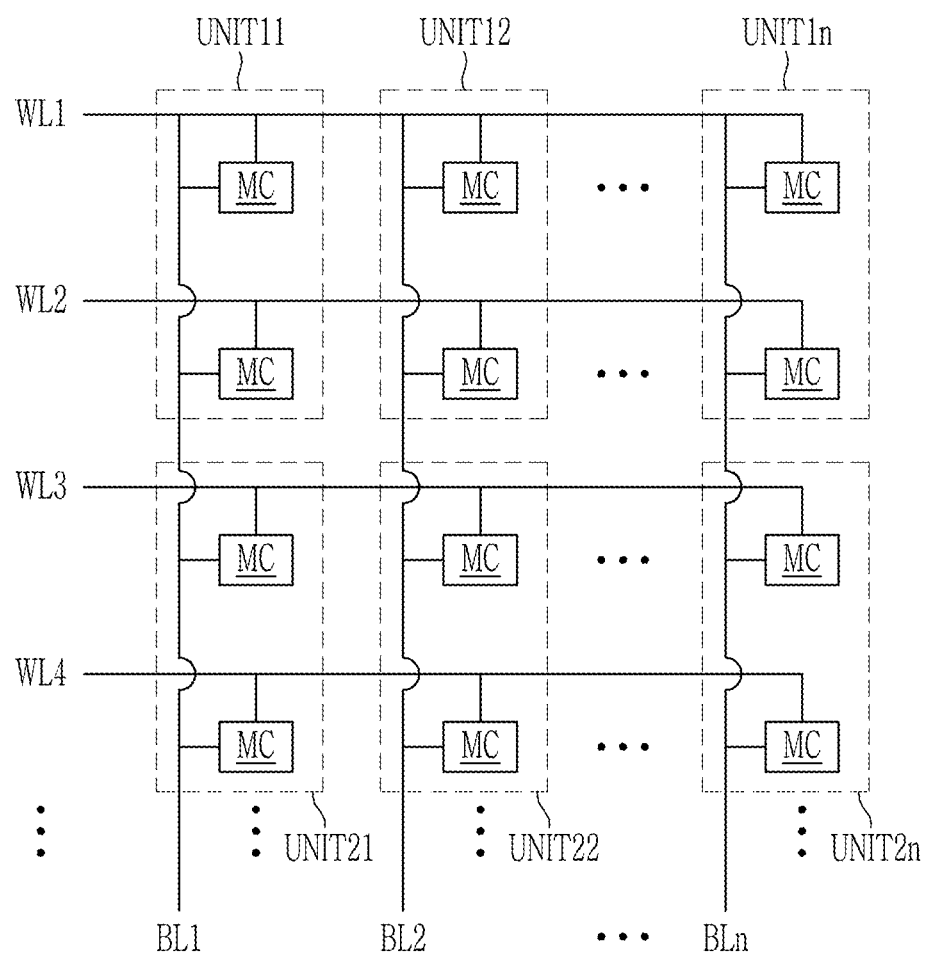
FIG. 7 illustrates an operation unit according to an embodiment of the present disclosure.

FIG. 7 shows an operation unit according to an embodiment of the present disclosure. Referring to FIG. 1 to FIG. 7, the memory cell array 122 may include a plurality of operation units UNIT. Each of the plurality of operation units UNIT may include two memory cells connected to the same bit line and connected to the different word lines from each other. In this case, the memory cells included in one operation unit UNIT may be included in each paired read row and storage row. For example, the operation unit UNIT11 may include a memory cell connected to the first bit line BL1 and included in the first read row RDRa, and a memory cell connected to the first bit line BL1 and included in the first storage row STRRa. Similarly, the operation unit UNIT2n may include the memory cell connected to the n-th bit line BLn and included in the second read row RDRb, and the memory cell connected to the n-th bit line BLn and included in the second storage row STRRb.

Two memory cells included in one operation unit UNIT may store the same weight as each other. For example, among the memory cells included in one operation unit UNIT, a memory cell included in the read row may be used for the calculation operation described with FIG. 4. In this case, among the memory cells included in one operation unit UNIT, a memory cell included in the storage row may be used to the restore operation described with FIG. 5A to FIG. 5B, and FIG. 6.

In an embodiment, among the memory cells included in one operation unit UNIT, the memory cell included in the read row may be a read cell.

In an embodiment, among the memory cells included in one operation unit UNIT, the memory cell included in the storage row may be a storage cell.

In an embodiment, the memory cells included in one operation unit UNIT may be referred to as being paired with each other.

That is, according an embodiment of the present disclosure, the memory device 120 may operate as a 2T-2C (2-transistor, 2-capacitor) unit. For example, the base unit in which the memory device 120 operates may include two memory cells paired with each other. Accordingly, each operation unit UNIT may include two transistors and two capacitors. However, the embodiments of the present disclosure are not limited thereto.

In an embodiment, while the restore operation is being performed, two memory cells included in one operation unit UNIT may be activated simultaneously or in concert with one another. However, the embodiments of the present disclosure are not limited thereto.

In an embodiment, two memory cells included in one operation unit UNIT may be connected to word lines adjacent to each other. However, the embodiments of the present disclosure are not limited thereto.

In an embodiment, the transistors of the memory cells included in one operation unit UNIT may share an active pattern. For example, two memory cells included in one operation unit UNIT may share a drain region formed in the center of the active pattern and may include different source regions. In this case, the drain region shared by two memory cells included in one operation unit UNIT may be connected to one bit line. However, the embodiments of the present disclosure are not limited thereto.

In an embodiment, when the memory cells included in one operation unit UNIT are configured to share the drain region, and word lines connected to these memory cells are simultaneously activated or activated in concert with each other, the charge may be moved through the shared drain region. In this case, because the charge movement path may be reduced or minimized (i.e., the charge may move without passing through the bit line), the time required to perform the restore operation described with reference to FIG. 6 may be reduced or minimized. However, the embodiments of the present disclosure are not limited thereto.

Figure 8:
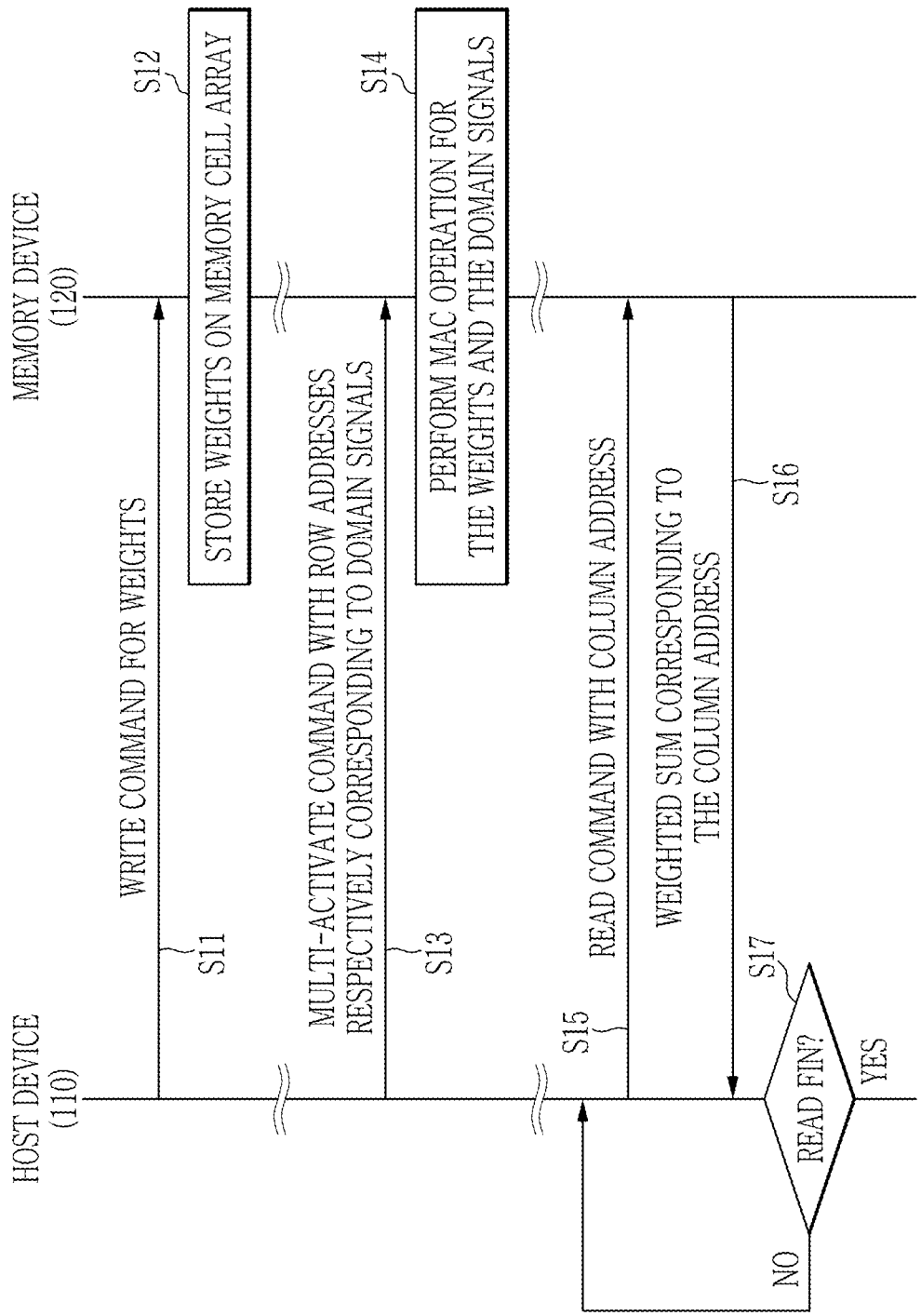
FIG. 8 is a flowchart illustrating an operation method of a memory system of FIG. 1.

FIG. 8 is a flowchart showing an operation method of a memory system of FIG. 1. Referring to FIG. 1 to FIG. 8, in an operation S11, a host device 110 may transmit a write command for weights to a memory device 120.

In an operation S12, the memory device 120 may store the weights received from the host device 110 in the memory cell array 122. For example, the memory device 120 may store the weights received from the host device 110 in the read rows RDR and the storage rows STRR.

For a more concise explanation, FIG. 8 shows an embodiment in which the memory device 120 stores the weights in response to a single write command, however the embodiments of the present disclosure are not limited to the number of times the host device 110 issues a write command. For example, the host device 110 may sequentially issue a plurality of write commands to store weights in all memory cells of the memory cell array 122.

In an embodiment, the host device 110 may utilize the memory device 120 to execute a neural network including a plurality of layers. In this case, the weights W stored in the memory device 120 may correspond to one of a plurality of layers of the neural network. Accordingly, when a layer to be calculated is changed, the memory system 100 may re-execute the operations S11 and S12 described above. However, the embodiments of the present disclosure are not limited thereto. It will be understood that the multi-layer neural network is a multi-layer artificial neural network comprising artificial neurons or nodes and does not include a biological neural network comprising real biological neurons.

In an embodiment, the host device 110 may store the different weights in the different areas of the memory device 120. For example, the host device 110 may store weights corresponding to the first layer of the neural network in the first bank of the memory device 120, and store weights corresponding to the second layer of the neural network in the second bank of the memory device 120. In this case, a number of updating weights stored in the memory device 120 may be reduced or minimized. However, the embodiments of the present disclosure are not limited thereto.

In an operation S13, the host device 110 may provide the multi-activate command to the memory device 120 with row addresses corresponding to domain signals DS respectively. The relationship between the domain signals DS and the row addresses has been previously described with reference to FIG. 4, and a further detailed description thereof is omitted.

In the operation S14, the memory device 120 may perform a MAC operation for the weights W and the domain signals DS. For example, the memory device 120 may perform the MAC operation by simultaneously activating or activating in concert the word lines corresponding to the row addresses RA provided in the operation S13. In this case, the sense amplifier 124 may store a plurality of weighted sums. For example, the first to n-th weighted sums WSM1 to WSMn may be respectively stored in the first to n-th sensing circuits SC1 to SCn. The specific method of performing the MAC operation through the memory device 120 has been previously described with reference to FIG. 4, and a further detailed description thereof is omitted.

In an embodiment, after a plurality of weighted sums are stored in the sense amplifier 124, the memory device 120 may perform the restore operation. For example, after the plurality of weighted sums are stored in the sense amplifier 124, the restore circuit 127 may sequentially perform the restore operation for the plurality of read rows by the method described with reference to FIG. 6. In this case, the restore operation may be performed regardless of whether the read operation stored in the sense amplifier 124 is completed. However, the embodiments of the present disclosure are not limited thereto.

In an operation S15, the host device 110 may transmit a read command and a column address to the memory device 120. For example, the host device 110 may determine a column address to be transmitted in the operation S15, based on which weights are to be used for generating and reading weighted sum. That is, the host device 110 may determine the column address based on which weighted sum (and weights and a bit line corresponding thereto) to be read.

In an operation S16, the memory device 120 may provide the weighted sum corresponding to the received column address to the host device 110. For example, the I/O circuit 125 may output the weighted sum stored in the sensing circuit corresponding to the column address to the host device 110. That is, the I/O circuit 125 may output the weighted sum stored in the sensing circuit connected to the bit line corresponding to the received column address to the host device 110.

In an operation S17, the host device 110 may determine whether the read operation is completed. For example, the host device 110 may determine whether a weighted sum to be read from the memory device 120 remains.

When the host device 110 determines that the read operation for the memory device 120 is not completed, the above-described operations S15 to S16 may be repeatedly executed. In this case, the first to n-th weighted sums WSM1 to WSMn stored in the first to n-th sensing circuits SC1 to SCn may be sequentially read.

When the host device 110 determines that the read operation for the memory device 120 is complete, the operation of the memory system 100 may be finished. However, the embodiments of the present disclosure are not limited thereto, and the host device 110 may provide a multi-activate command based on the new domain signals DS to the memory device 120 or write the new weights into the memory device 120.

In an embodiment, when the host device 110 determines that the read operation on the memory device 120 is complete, the host device 110 may provide a precharge command to the memory device 120. However, the embodiments of the present disclosure are not limited thereto.

Figure 9:
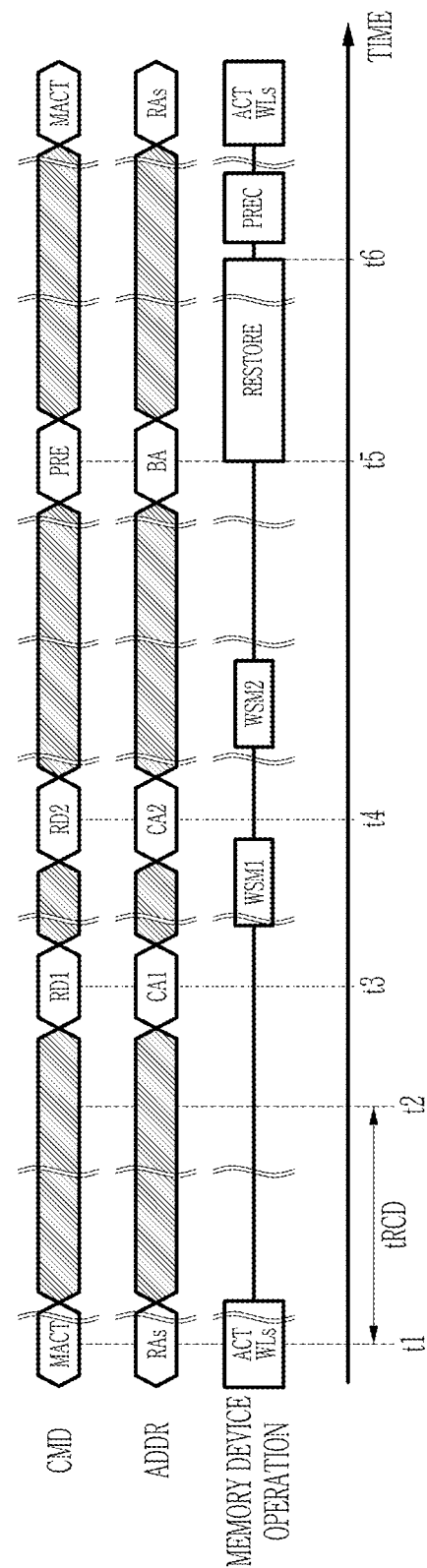
FIG. 9 is a timing diagram showing an operation of a memory device according to an embodiment of the present disclosure.

FIG. 9 is a timing diagram illustrating an operation of a memory device according to an embodiment. Referring to FIG. 1 to FIG. 9, at a first time point t1, the memory device 120 may receive a multi-activate command MACT and plurality of row addresses RA from the host device 110. For example, the memory device 120 may receive command/address signals C/A indicating the multi-activate command MACT and a plurality of row address RA from the host device 110.

In an embodiment, a plurality of row addresses RA provided to the memory device 120 at the first time point t1 may refer to some of the word lines connected to the plurality of read rows RDR.

At first time point t1, the memory device 120 may simultaneously or in concert with each other activate a plurality of word lines WL in response to the received row addresses RA. For example, the row decoder 123 may simultaneously or in concert with each other activate a plurality of word lines WL corresponding to the received row addresses RA.

In an embodiment, each of the plurality of word lines WL activated at the first time point t1 may be included in the read area RDA and may not be included in the storage area STRA. For example, each of a plurality of word lines WL activated at the first time point t1 may be one of the read rows RDR. In this case, even if a plurality of word lines WL are activated simultaneously or in concert with each other, the charge charged in the capacitor CAP included in each of the memory cells of the storage rows STRR may not leak.

During a row command delay time tRCD after the first time point t1, a weighted sum based on the plurality of activated word lines WL may be calculated. For example, the sense amplifier 124 may detect the voltage level of a plurality of bit lines BL to determine the weighted sums WSM. In this case, the weighted sums WSM may be stored in the sense amplifier 124 at the second time point t2 after the row command delay time tRCD has elapsed from the first time point t1.

After the second time point t2, the memory device 120 may return the weighted sum to the host device 110 in response to the read command RD. For example, the memory device 120 may receive the first read command RD1 and the first column address CA1 at a third time point t3 after the second time point t2; and receive the second read command RD2 and the second column address CA2 at a fourth time point t4. Hereinafter, for more concise description, it is assumed that the first column address CA1 corresponds to the first bit line BL1, and the second column address CA2 corresponds to the second bit line BL2.

The memory device 120 may output the first weighted sum WSM1 stored in the sensing circuit corresponding to the first column address CA1 to the host device 110 in response to the first read command RD1. That is, after a predetermined time has elapsed from the third time point t3, the I/O circuit 125 may output the first weighted sum WSM1 from the first sensing circuit SC1 to the host device 110.

The memory device 120 may output the second weighted sum WSM2 stored in the sensing circuit corresponding to the second column address CA2 to the host device 110 in response to the second read command RD2. That is, after a predetermined time has elapsed from the fourth time point t4, the I/O circuit 125 may output the second weighted sum WSM2 from the second sensing circuit SC2 to the host device 110.

For a more concise explanation, FIG. 9 illustrates the embodiment in which the first weighted sum WSM1 is output to the host device 110 between the third time point t3 and the fourth time point t4, but the embodiments of the present disclosure are not limited thereto. For example, the first weighted sum WSM1 may be returned to the host device 110 after a certain time (e.g., a read delay time or a read latency) has elapsed from the third time point t3, regardless of the fourth time point t4.

After all read operations are completed, the memory device 120 may receive a precharge command PRE from the host device 110 at a fifth time point t5. For example, after the read operation for the weighted sums calculated through the multi-activate command MACT issued at the first time point t1 is completed, the host device 110 may issue the precharge command PRE.

In an embodiment, the memory device 120 may receive at least one bank address BA along with the precharge command PRE. However, the embodiments of the present disclosure are not limited thereto.

In an embodiment, after issuing the precharge command PRE, the host device 110 may no longer issue the read command for the weighted sums WSM stored in a sense amplifier 124.

The memory device 120 may perform a restore operation after receiving the precharge command PRE. For example, the memory device 120 may perform the restore operation RESTORE from the fifth time point t5 to the sixth time point t6.

That is, during the fifth time point t5 to sixth time point t6, the restore circuit 127 may perform the restore operation for a plurality of read rows RDR based on the plurality of storage rows STRR. For example, the restore circuit 127 may restore the data stored in the first storage row STRRa to first read row RDRa. In a similar manner, the restore circuit 127 may sequentially perform the restore operation for the read rows connected to the word lines activated at the first time point t1.

After the sixth time point t6, the memory device 120 may perform the precharge operation. For example, the memory device 120 may perform the precharge operation for the memory banks corresponding to the bank address BA. In this case, the precharged memory bank may enter an idle state.

For a more concise explanation, FIG. 9 representatively illustrates the embodiment in which the memory device 120 performs the restore operation RESTORE in response to the precharge command PRE, but the embodiments of the present disclosure are not limited thereto. For example, the memory device 120 may perform the restore operation by receiving an arbitrary type of command notifying the end of the read operation instead of the precharge command. That is, the embodiments of the present disclosure are not limited to the type of the command triggering the restore operation RESTORE.

FIG. 10 is a flowchart illustrating operations of a memory system according to an embodiment of FIG. 9. Referring to FIG. 1 to FIG. 9, in an operation S110, the host device 110 may provide a multi-activate command MACT to the memory device 120 with a plurality of row addresses RA. For example, the host device 110 may provide the multi-activate command MACT with the plurality of row addresses RA to the memory device 120 at the first time point t1. In this case, each of the plurality of row addresses RAs may correspond to the different domain signals. The operation S110 is similar to the operation S13 described with reference to FIG. 8 so that a detailed description thereof is omitted.

In operation S120, the memory device 120 may activate the word lines corresponding to the received row addresses RA simultaneously or in concert with each other. For example, at the first time point t1, the memory device 120 may simultaneously activate or activate in concert with each other the word lines corresponding to the received row addresses RA. In this case, during the row command delay time tRCD, a weighted sum based on the plurality of activated word lines WL may be calculated. For example, the sense amplifier 124 may sense the voltage level of a plurality of bit lines BL to determine (i.e., calculate) the weighted sums WSM.

In an operation S130, the memory device 120 may store the weighted sums WSM in the sense amplifier 124. For example, at the second time point t2, each of the first to n-th sensing circuits SC1 to SCn included in the sense amplifier 124 may store the weighted sum determined by detecting the voltage level change of the connected bit line.

In an operation S140, the host device 110 may transmit the read command and column address to the memory device 120. For example, the host device 110 may transmit the first read command RD1 and the first column address CA1 to the memory device 120 at the third time point t3.

In an operation S150, the memory device 120 may provide the weighted sum corresponding to the received column address to the host device 110. For example, the memory device 120 may output the first weighted sum WSM1 to the host device 110.

In an operation S160, the host device 110 may determine whether the read operation is completed. The operation S160 is similar to the operation S17 of FIG. 8, so that the detailed description thereof may be omitted.

In an embodiment, when it is determined that the read operation is completed in the operation S160, the operation S170 may be performed.

In an embodiment, when it is determined that the read operation is not completed in the operation S160, the operations S140 to S150 may be repeatedly performed. For example, the host device 110 may transmit the second read command RD2 and the second column address CA2 to the memory device 120 at the fourth time point t4. In this case, the memory device 120 may output the second weighted sum WSM2 to the host device 110.

In an operation S170, the host device 110 may transmit the precharge command PRE to the memory device 120. For example, the host device 110 may transmit the precharge command PRE to the memory device 120 at the fifth time point t5. In this case, the precharge command PRE may indicate that the host device 110 may no longer read the weighted sums WSM stored in the sense amplifier 124. However, the embodiments of the present disclosure are not limited to the type of command transmitted in the operation S170.

In an operation S180, the memory device 120 may perform a restore operation for the read rows RDR based on the data stored in the storage rows STRR. For example, the memory device 120 may perform the restore operation RESTORE from the fifth time point t5 to the sixth time point t6. The operation S180 is described in more detail with reference to FIG. 11A to FIG. 11B below.

In an embodiment, after the operation S180, the memory device 120 may perform a precharge operation. In this case, the memory device 120 may enter an idle state (IDLE). For example, after performing the precharge operation, the memory device 120 may operate in response to various types of commands such as a self-refresh entry command and an activation command.

Figure 11A:
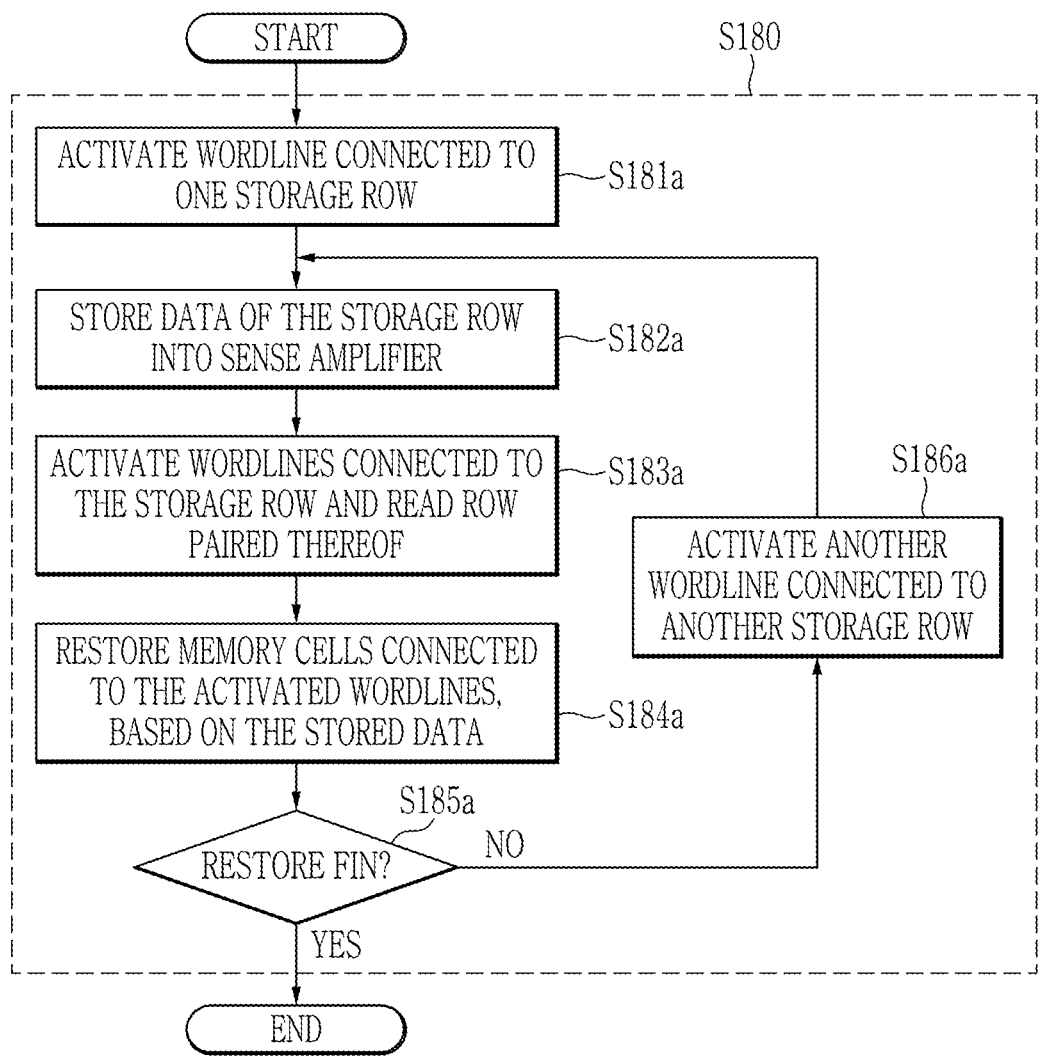
FIG. 11A and FIG. 11B are flowcharts showing an operation of FIG. 10 in detail.
Figure 11B:
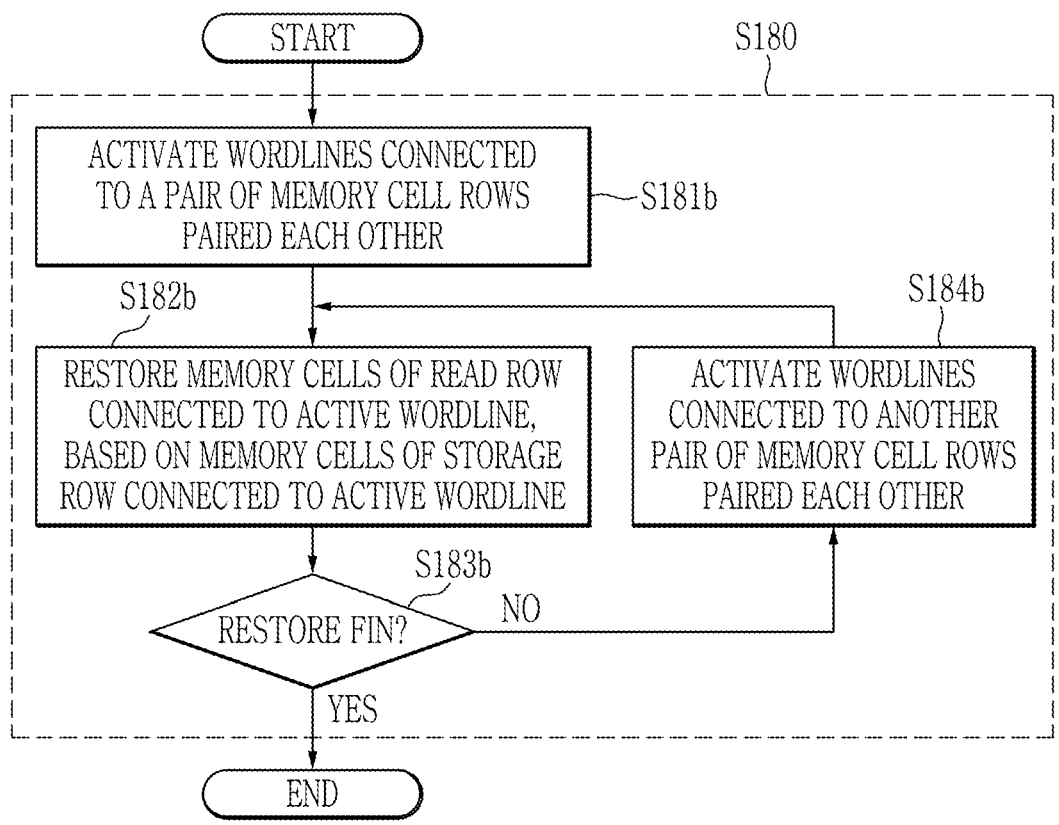

FIG. 11A to FIG. 11B are flowcharts illustrating an operation S180 of FIG. 10 in detail. Hereinafter, the operation S180 implemented according to the embodiment of FIG. 5A and FIG. 5B is described in more detail with reference to FIG. 11A, and the operation S180 implemented according to the embodiment of FIG. 6 is described in more detail with reference to FIG. 11B.

First, referring to FIG. 1 to FIG. 4, FIG. 5A to FIG. 5B, FIG. 7 to FIG. 10, and FIG. 11A, the operation S180 may include operations S181a to S186a.

In an operation S181a, the memory device 120 may activate a word line connected to one storage row STRR. For example, the restore circuit 127 may control a row decoder 123 to activate the second word line WL2 connected to the first storage row STRRa.

In the operation S182a, the memory device 120 may store the data stored in the storage row connected to the word line activated in the operation S181a to the sense amplifier 124. For example, the sense amplifier 124 may store the data stored in the memory cells of the first storage row STRRa. In more detail, the first sensing circuit SC1 may store the data of the memory cell connected to the first bit line BL1 among the memory cells of the first storage row STRRa; and the second sensing circuit SC2 may store the data of the memory cell connected to the second bit line BL2 among the memory cells of the first storage row STRRa.

In an operation S183a, the memory device 120 may activate the word lines connected to the storage row in the operation S182a and the read row paired thereto. For example, the memory device 120 may simultaneously activate or activate in concert with each other the second word line WL2 connected to the first storage row STRRa and the first word line WL1 connected to the first read row RDRa.

In an operation S184a, the memory device 120 may restore the memory cells connected the activated word lines based on the data stored in the sense amplifier 124. For example, the data stored in the sense amplifier 124 may be equally stored in the memory cells of the first storage row STRRa and the first read row RDRa. In more detail, the data stored in the first sensing circuit SC1 may be stored in the memory cells connected to the first bit line BL1 of the first storage row STRRa and the first read row RDRa. Similarly, the data stored in the second sensing circuit SC2 may be stored in the memory cells connected to the second bit line BL2 of the first storage row STRRa and the first read row RDRa.

In an operation S185a, the memory device 120 may determine whether all restore operations have been completed. For example, the restore circuit 127 may determine whether the restore operation for all read rows activated in response to the multi-activate command MACT has been completed. However, the embodiments of the present disclosure are not limited thereto, and the restore circuit 127 may determine whether the restore operation for all read rows included in the read area RDA has been completed.

In an operation S185a, when it is determined that the restore operation is not completed, an operation S186a may be performed.

In the operation S186a, the memory device 120 may activate the word lines connected to another storage row STRR. For example, the restore circuit 127 may control the row decoder 123 to activate fourth word lines WL4 connected to the second storage row STRRb. That is, the memory device 120 may sequentially activate the storage rows paired with the read rows activated in the step S120.

Thereafter, the memory device may repeatedly perform the operations S182a to S185a described above. That is, the memory device 120 may sequentially perform the restore operation for the read rows activated in the operation S120.

In the operation S185a, when it is determined that all restore operations are completed, the operation S180 may be ended. In this case, the memory device 120 may enter an idle state by performing a precharge operation.

Continuing with reference to FIG. 1 to FIG. 4, FIG. 6 to FIG. 10, and FIG. 11B, the operation S180 may include operations S181b to S184b.

In an operation S181b, the memory device 120 may activate the word lines connected to one memory cell row pair paired with each other. For example, the restore circuit 127 may control a row decoder 123 to simultaneously activate or activate in concert with each other the first and second word lines WL1 and WL2.

In the operation S182b, the memory device 120 may restore the memory cells of the read row of the activated word lines based on the memory cells of the storage row connected to the activated word lines. For example, in a manner similar to that described with reference to FIG. 6 above, the data stored in the first storage row STRRa may be stored in the first read row RDRa.

In an operation S183b, the memory device 120 may determine whether all restore operations have been completed. The operation of the memory device 120 according to the operation S183b is similar to the operation S185a described with reference to FIG. 11A above so that a detailed description thereof is omitted.

In the operation S183b, when it is determined that the restore operation is not completed, an operation S184b may be performed.

In an operation S184b, the memory device 120 may activate the word lines connected to another pair of memory cell rows paired with each other. For example, the restore circuit 127 may control the row decoder 123 to simultaneously activate or activate in concert with each other the third and fourth word lines WL3 and WL4. That is, the memory device 120 may sequentially activate the read rows activated in the operation S120 and the storage rows paired thereto.

Thereafter, the memory device may be operated by repeating the operations S182b to S184b described above. That is, the memory device 120 may sequentially perform the restore operation for the read rows activated in the operation S120.

In the operation S183b, when it is determined that all restore operations are completed, the operation S180 may be ended. In this case, the memory device 120 may enter an idle state by performing a precharge operation.

Figure 12:
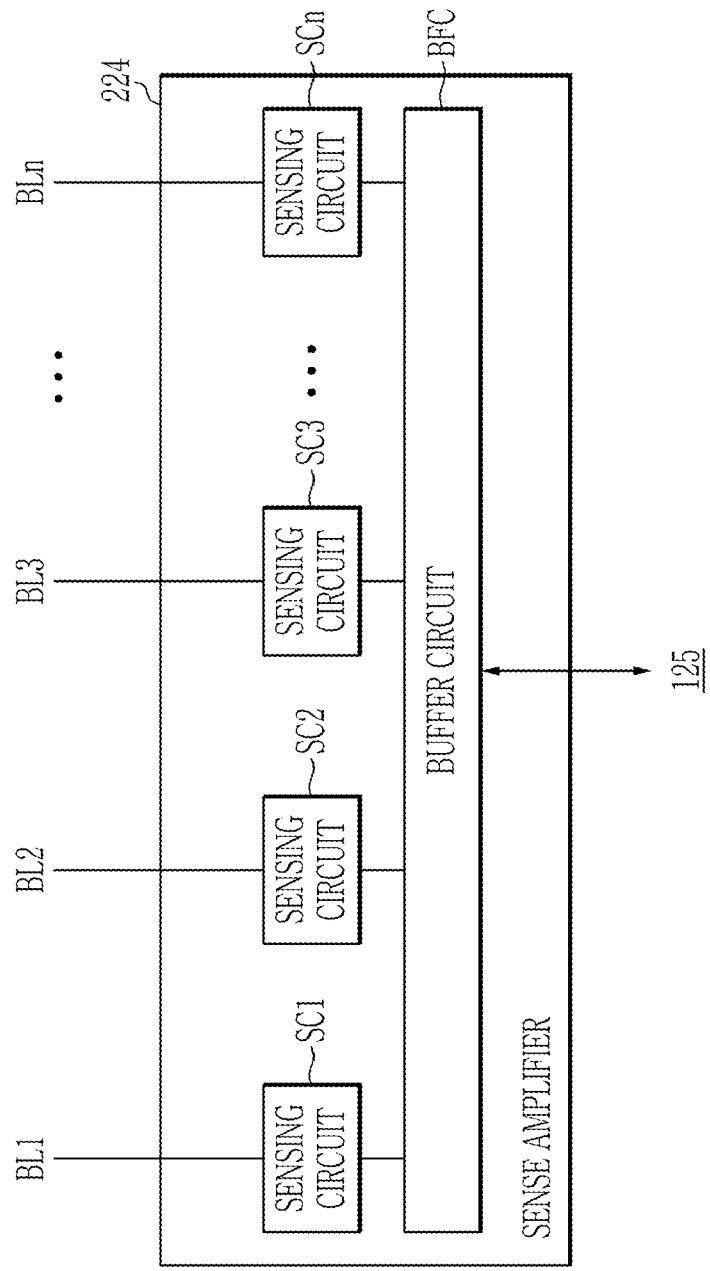
FIG. 12 is a block diagram illustrating a sense amplifier of FIG. 2 according to an embodiment.

FIG. 12 is a block diagram illustrating a sense amplifier of FIG. 2 according to an embodiment of the disclosure. Referring to FIG. 1 to FIG. 8, and FIG. 12, the sense amplifier 124 of FIG. 2 may be realized by the sense amplifier 224 of FIG. 12.

The sense amplifier 224 may include first to n-th sensing circuits SC1 to SCn. Each of the first to n-th sensing circuits SC1 to SCn may be connected to each of the first to n-th bit lines BL1 to BLn. The function and operation of each of the first to n-th sensing circuits SC1 to SCn are similar to those described above, so detailed descriptions thereof are omitted.

The sense amplifier 224 may include a buffer circuit BFC. The buffer circuit BFC may be connected to the first to n-th sensing circuits SC1 to SCn. The buffer circuit BFC may receive the weighted sums WSM from the first to n-th sensing circuits SC1 to SCn. For example, the first to n-th weighted sums WSM1 to WSMn may be received from the first to n-th sensing circuits SC1 to SCn.

The buffer circuit BFC may temporarily store the received weighted sums WSM. The buffer circuit BFC may output the stored weighted sums WSM to the host device 110 through the I/O circuit 125. For example, when the read command is received from the host device 110, the I/O circuit 125 may output one of the first to n-th weighted sums WSM1 to WSMn stored in the buffer circuit BFC to the host device 110.

In an embodiment, when the weighted sum stored in the buffer circuit BFC is output to the host device 110 in response to a read command, the restore operation may be performed regardless of whether a read operation of the host device 110 is completed. That is, if the weighted sums WSM are stored in the buffer circuit BFC, even if the first to n-th sensing circuits SC1 to SCn do not store the weighted sums WSM, the weighted sum may be output to the host device 110 in response to a read command. Accordingly, according to the embodiment of FIG. 12, when the weighted sums WSM are stored in the buffer circuit BFC, the first to n-th sensing circuits SC1 to SCn may perform the restore operation by the method described with reference to FIG. 5A to FIG. 5B in response to the control of the restore circuit 127. However, the embodiments of the present disclosure are not limited thereto. For example, the restore circuit 127 may perform the restore operation by the method described with reference to FIG. 6 above after storing the weighted sums WSM in the buffer circuit BFC.

Figure 13:
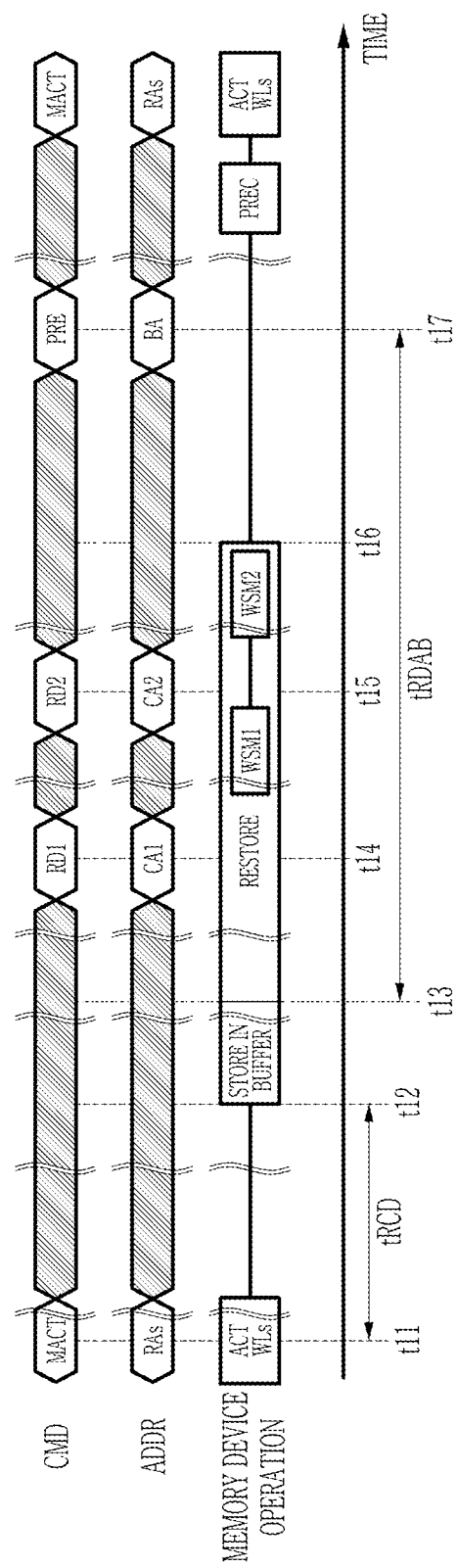
FIG. 13 is a timing diagram illustrating an operation of a memory device according to an embodiment of FIG. 12.

FIG. 13 is a timing diagram illustrating an operation of a memory device according to an embodiment of FIG. 12. Referring to FIG. 1 to FIG. 8, and FIG. 12 to FIG. 13, at an eleventh time point t11, the memory device 120 may receive the multi-activate command MACT and the plurality of row addresses RA from the host device 110. In this case, the weighted sums WSM may be stored in the sense amplifier 224 at a twelfth time point t12 after a row command delay time tRCD from the eleventh time point t11. The operation of the memory device 120 from the eleventh time point t11 to the twelfth time point t12 is similar to the operation of the memory device 120 of the first time point t1 to the second time point t2 described with reference to FIG. 9 above so that it will not be described in further detail.

At the twelfth time point t12 to the thirteenth time point t13, the memory device 120 may store the weighted sums WSM stored in the first to n-th sensing circuits SC1 to SCn in the buffer circuit BFC. Accordingly, after the thirteenth time point t13, the memory device 120 may output the weighted sum stored in the buffer circuit BFC to the host device 110 in response to the read command.

For example, the memory device 120 may receive the first read command RD1 and the first column address CA1 at a fourteenth time point t14 after the thirteenth time point t13; and may receive the second read command RD2 and the second column address CA2 at a fifteenth time point t15. Hereinafter, for more concise description, it is assumed that the first column address CA1 corresponds to the first bit line BL1, and the second column address CA2 corresponds to the second bit line BL2.

The memory device 120 may output the first weighted sum WSM1 corresponding to the first column address CA1 to the host device 110 in response to the first read command RD1. That is, after a certain amount of time has elapsed from the fourteenth time point t14, the I/O circuit 125 may output the first weighted sum WSM1 from the buffer circuit BFC to the host device 110.

The memory device 120 may output the second weighted sum WSM2 corresponding to the second column address CA2 to the host device 110 in response to the second read command RD2. That is, after a certain amount of time has elapsed from the fifteenth time point t15, the I/O circuit 125 may output the second weighted sum WSM2 from the buffer circuit BFC to the host device 110.

For a more concise explanation, FIG. 13 representatively illustrates the embodiment in which the first weighted sum WSM1 is output to the host device 110 between the fourteenth time point t14 and the fifteenth time point t15, but the embodiments of the present disclosure are not limited thereto. For example, the first weighted sum WSM1 may be returned to the host device 110 after a certain time (e.g., a read delay time or a read latency) has elapsed from the fourteenth time point t14 regardless of the fifteenth time point t15.

Meanwhile, the memory device 120 may perform the restore operation at the thirteenth time point t13 to the sixteenth time point t16. For example, the restore circuit 127 may perform the restore operation for the read rows RDR even if a command (e.g., a precharge command PRE) notifying that the read operation has been completed is not received from the host device 110.

In an embodiment, the fourteenth time point t14 and the fifteenth time point t15 may precede the sixteenth time point t16. That is, according to the embodiment disclosed in FIG. 12 and FIG. 13, the host device 110 may transmit the read command and receive the weighted sum from the memory device 120 even before the restore operation RESTORE inside the memory device 120 is completed. However, the embodiments of the present disclosure are not limited thereto.

The memory device 120 may receive the precharge command PRE at a seventeenth time point t17. That is, according to the embodiment disclosed in FIG. 12 and FIG. 13, the host device 110 may read the weighted sum from the memory device 120 by issuing the read command during a read available period tRDAB between the thirteenth time point t13 and the seventeenth time point t17. That is, the read available period tRDAB may refer to a time period during which the host device 110 may read the weighted sum stored in the buffer circuit BFC by transmitting the read command to the memory device 120.

After the seventeenth time point t17, the memory device 120 may enter an idle state by performing a precharge operation PREC in response to the precharge command PREC. However, the embodiments of the present disclosure are not limited thereto.

Figure 14:
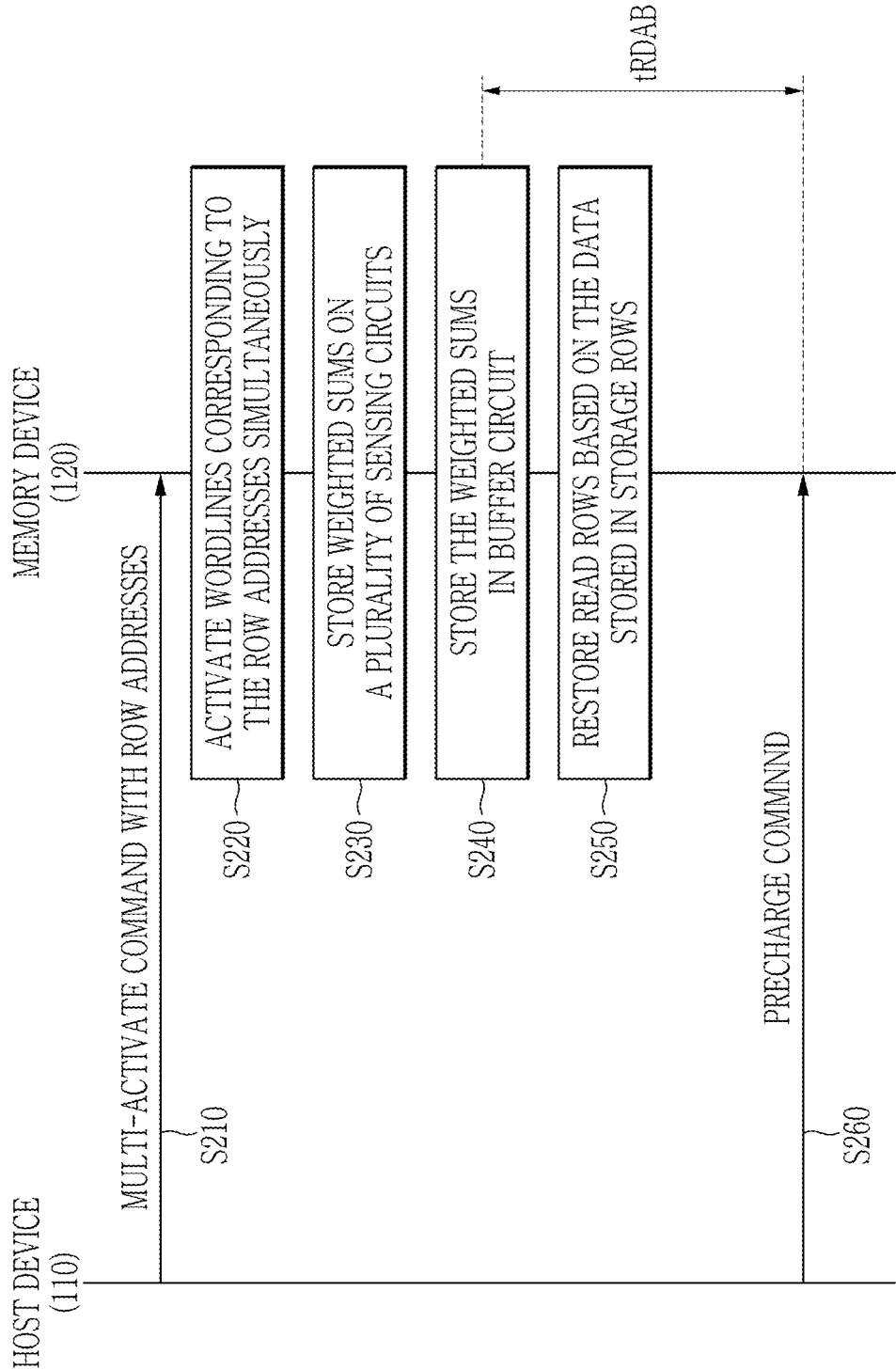
FIG. 14 is a flowchart illustrating an operation of a memory system according to an embodiment of FIG. 13.

FIG. 14 is a flowchart illustrating an operation of a memory system according to an embodiment of FIG. 13. Referring to FIG. 1 to FIG. 8, and FIG. 12 to FIG. 14, in an operation S210, the host device 110 may provide the multi-activate command MACT to the memory device 120 together with a plurality of row addresses RA. In an operation S220, the memory device 220 may simultaneously activate or activate in concert word lines corresponding to the received row addresses RA. The operations S210 to S220 are similar to the operations S110 to S120 described with reference to FIG. 10 above so that the detailed description thereof is omitted.

In an operation S230, the memory device 120 may store weighted sums WSM in a plurality of sensing circuits. For example, the memory device 120 may store the first to n-th weighted sums WSM1 to WSMn in the first to n-th sensing circuits SC1 to SCn, respectively.

In an operation S240, the memory device 120 may store the weighted sums WSM in the buffer circuit BFC. In this case, all of first to n-th weighted sums WSM1 to WSMn may be stored in the buffer circuit BFC.

In an operation S250, the memory device 120 may perform a restore operation for the read rows RDR based on the data stored in the storage rows STRR. The operation of the memory device 120 in the operation S250 is similar to the operation S180 described with reference to FIG. 10, and FIG. 11A to FIG. 11B above so that it will not be described in further detail.

In an operation S260, the host device 110 may transmit a precharge command PRE to the memory device 120. In this case, the host device 110 may perform a precharge operation PREC and enter an idle state.

In an embodiment, during the read available period tRDAB between the execution of the operation S240 and the execution of the operation S260, the host device 110 may issue the read command to read a weighted sum from the memory device 120.

Figure 15:
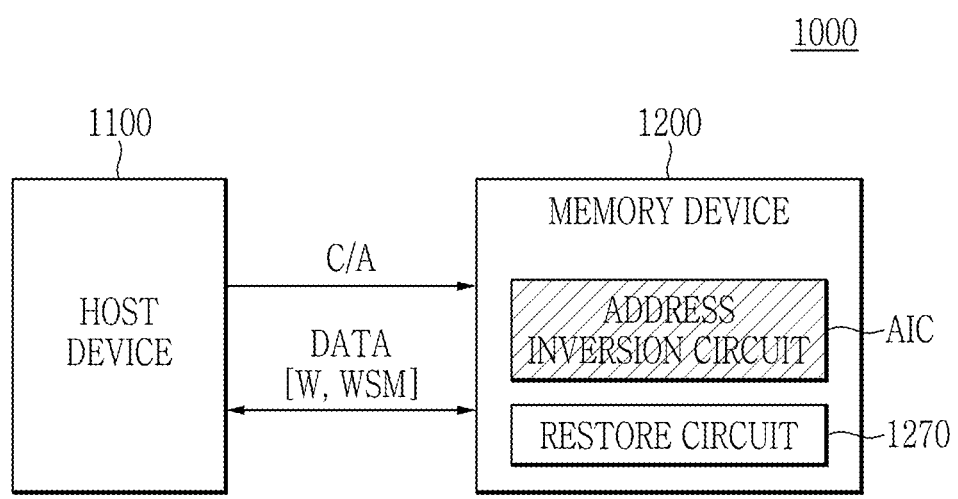
FIG. 15 is a block diagram illustrating a memory system according to an embodiment of the present disclosure.

FIG. 15 is a block diagram illustrating a memory system according to an embodiment. Referring to FIG. 15, the memory system 1000 may include a host device 1100 and a memory device 1200.

The host device 1100 may store the data DATA in the memory device 1200 or read the data DATA from the memory device 1200 through command/address signals C/A. The configuration and operation of the host device 1100 are similar to the configuration and operation of the described host device 1100 previously referred to in FIG. 1 so that they will not be described in further detail.

The memory device 1200 may include a restore circuit 1270 and an address inversion circuit (AIC). The operation of the restore circuit 1270 may be similar to the operation of the restore circuit 127 described with reference to FIG. 1 to FIG. 14 above.

The address inversion circuit AIC may receive and invert a row address. For example, the address inversion circuit AIC may invert the row address provided through the command/address signals C/A from the host device 1100. Alternatively, the address inversion circuit AIC may invert the row address received from the restore circuit 1270. A more detailed operation of the address inversion circuit AIC is described in more detail with reference to FIG. 16 below.

Figure 16:
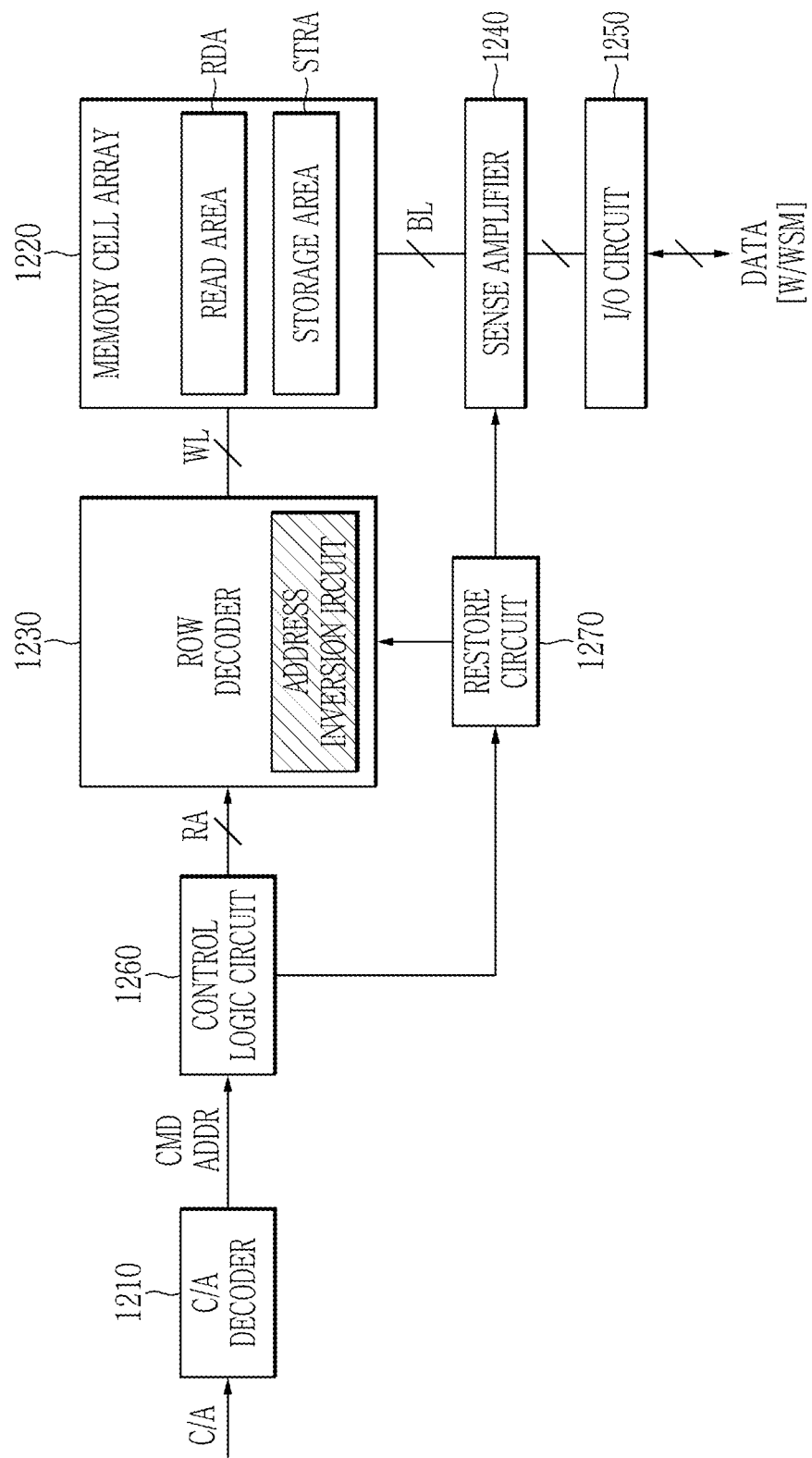
FIG. 16 is a block diagram illustrating a memory device in FIG. 15 in more detail.

FIG. 16 is a block diagram illustrating a memory device of FIG. 15 in detail. Referring to FIG. 15 and FIG. 16, the memory device 1200 may include a command/address decoder 1210, a memory cell array 1220, a row decoder 1230, a sense amplifier 1240, an I/O circuit 1250, a control logic circuit 1260, and a restore circuit 1270.

The specific functions and operations of the command/address decoder 1210, the memory cell array 1220, the sense amplifier 1240, the I/O circuit 1250, the control logic circuit 1260, and the restore circuit 1270 are similar to those described with reference to FIG. 2 above so that they will not be described in further detail.

The memory cell array 1220 may include a read area RDA and a storage area STRA. Each of the read area RDA and the storage area STRA may include a plurality of memory cell rows. Each of the memory cell rows included in the read area RDA may be paired with the memory cell row included in the storage area STRA. The relationship between the paired memory cell rows is similar to that described with reference to FIG. 3 so that it will not be described in further detail.

The row decoder 1230 may include an address inversion circuit AIC. The address inversion circuit AIC may change a received row address to the row address of a memory cell row, which is paired to a memory cell row corresponding to the received row address. That is, the address inversion circuit AIC may invert a row address for the read row RDR to a row address for storage row STRR, or invert a row address for the storage row STRR to a row address for the read row RDR.

The address inversion circuit AIC may operate only during a specific time period and may not operate during other time periods. For example, a time period in which the address inversion circuit AIC does not operate will be referred to as a first time period, and a time period in which the address inversion circuit AIC operates will be referred to as a second time period.

During the first time period when the address inversion circuit AIC is not operated, the read area RDA may include the memory cell rows connected to odd numbered word lines, and the storage area STRA may include the memory cell rows connected to even numbered word lines. That is, during the first time period, the memory device 1200 may operate in the manner similar to that of the memory device 120 described with reference to FIG. 1 to FIG. 7 above.

In further embodiments, during the second time period in which the address inversion circuit AIC operates, the read area RDA may include the memory cell rows connected to the even numbered word lines, and the storage area STRA may include the memory cell rows connected to the odd numbered word lines. That is, in the first time period and the second time period, the word lines connected to the memory cell rows operated by the read area RDA may be different from each other. Similarly, in the first time period and the second time period, the word lines connected to the memory cell rows operated by the storage area STRA may be different from each other.

Accordingly, according to an embodiment of FIG. 15 to FIG. 16, the number of the operations of the memory cells of the memory device 1200 may become uniform, and, thus, the operation life-span of the memory device 1200 may increase.

Figure 17:
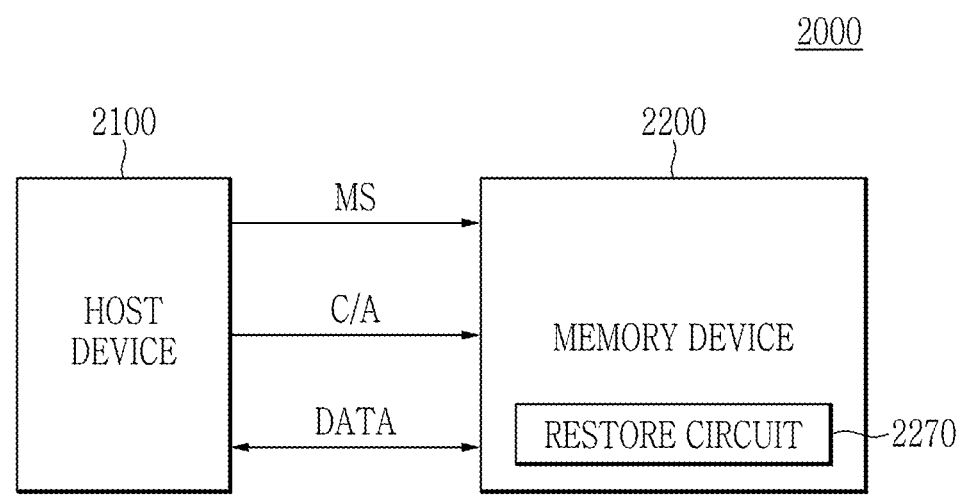
FIG. 17 is a block diagram illustrating a memory system according to an embodiment of the present disclosure.

FIG. 17 is a block diagram illustrating a memory system according to an embodiment. Referring to FIG. 17, the memory system 2000 may include a host device 2100 and a memory device 2200. The memory device 2200 may include a restore circuit 2270.

The host device 2100 may store a data item DATA in the memory device 2200 or read a data item DATA from the memory device 2200 through command/address signals C/A.

The host device 2100 may provide a mode selection signal MS to the memory device 2200. For example, the host device 2100 may provide the mode selection signal MS to the memory device 2200 through pins connected to the memory device 2200. For example, the host device 2100 may provide the mode selection signal MS to the memory device 2200 through any combination of the command/address signals C/A transmitted through command/address pins. However, the embodiments of the present disclosure are not limited to a specific method of transmitting the mode selection signal MS. For example, the host device 2100 may transmit the mode selection signal MS through a separate pin.

In response to the mode selection signal MS, the memory device 2200 may operate in one of a first operation mode operating with a PIM (process-in-memory) and a second operation mode operating with the memory of the host device 2100.

When the mode selection signal MS indicates the first operation mode, the memory device 2200 may operate to output the weighted sum by performing a MAC operation. For example, the memory device 2200 may be operated in a similar way to the embodiment described with reference to FIG. 1 to FIG. 14.

When the mode selection signal MS indicates the second operation mode, the memory device 2200 may operate in the manner similar to a generally-used volatile memory device. For example, the memory device 2200 may operate as a main memory of the host device 2100.

That is, according to the embodiment of FIG. 17, the memory device 2200 may be implemented to selectively perform the MAC operation according to an operation mode. For example, the restore circuit 2270 may operate only in the first operation mode and may not operate in the second operation mode described above. In this case, because the single memory device 2200 may perform two different functions, an implementation cost of the memory system 2000 may be reduced.

Figure 18:
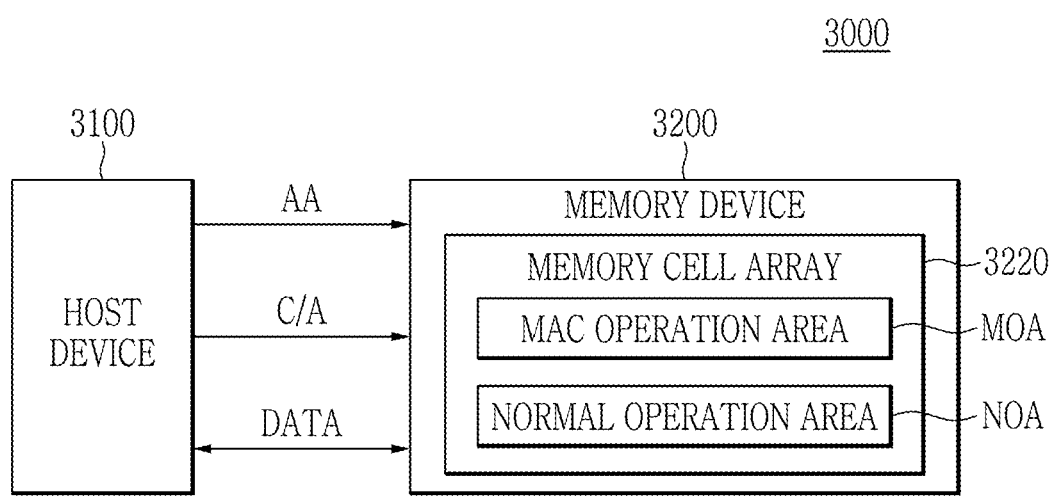
FIG. 18 is a block diagram illustrating a memory system according to an embodiment of the present disclosure.

FIG. 18 is a block diagram illustrating a memory system according to an embodiment. Referring to FIG. 18, a memory system 3000 may include a host device 3100 and a memory device 3200. The memory device 3200 may include a memory cell array 3220.

The memory cell array 3220 may include a MAC operation area MOA and a normal operation area NOA. Each of the MAC operation area MOA and the normal operation area NOA may include a plurality of memory cells.

The MAC operation area MOA may be used for the MAC operation previously described with reference to FIG. 1 to FIG. 14. For example, the MAC operation area MOA may include the described read area RDA and storage area STRA previously referred to in FIG. 2. In this case, the read area RDA may be used for the MAC operation, and the storage area STRA may be used for the restore operation for the read area RDA.

The normal operation area NOA may be used as a storage space of the host device 3100. For example, the memory cells of the normal operation area NOA may be implemented to store the data DATA or to output the stored data DATA to the host device 3100 in response to the control of the host device 3100.

The host device 3100 may control the MAC operation area MOA and the normal operation area NOA through command/address signals C/A. For example, the host device 3100 may control the MAC operation area MOA by issuing an address corresponding to the MAC operation area MOA, and may control the normal operation area NOA by issuing an address corresponding to the normal operation area NOA. However, the embodiments of the present disclosure are not limited thereto.

In an embodiment, the number of the memory cells included in the MAC operation area MOA and the normal operation area NOA may be adjusted. For example, the host device 3100 may provide an area adjust signal (AA) to the memory device 3200. In this case, the memory device 3200 may adjust the size (more specifically, the number of the memory cells) of the MAC operation area MOA and the normal operation area NOA in response to the area adjust signal AA.

In an embodiment, the MAC operation area MOA and the normal operation area NOA may be connected to different word lines.

In an embodiment, the host device 3100 may provide the area adjust signal AA to the memory device 2200 through pins connected to the memory device 3200. For example, the host device 3100 may provide the area adjust signal AA to the memory device 3200 through any combination of command/address signals C/A transmitted through command/address pins. However, the embodiments of the present disclosure are not limited to a specific method of transmitting the area adjust signal AA.

The above-described contents are specific embodiments for implementing the present disclosure. The present disclosure will include not only the above-described embodiments, but also embodiments that may be simply design-changed or easily changed. In addition, the present disclosure will also include techniques that may be easily modified and implemented by using the embodiments. While the present disclosure has been described with reference to embodiments thereof, it will be apparent to those of ordinary skill in the art that various changes and modifications may be made thereto without departing from the spirit and scope of the disclosure as set forth in the following claims.

What is claimed is:

1. A memory device comprising:
a memory cell array including first to fourth memory cells respectively connected to first to fourth word lines;
a sense amplifier including a first sensing circuit configured to generate a first weighted sum, based on a first weight stored in the first memory cell and a second weight stored in the third memory cell, in response to an activation of the first and third word lines at a first time point;
an input and output circuit configured to output the first weighted sum to an external device in response to a first read command; and
a restore circuit configured to perform a restore operation for storing a first data item stored in the second memory cell to the first memory cell and for storing a second data item stored in the fourth memory cell to the third memory cell after the first time point.

2. The memory device of claim 1, wherein:
the first data item is the first weight, and
the second data item is the second weight.

3. The memory device of claim 2, wherein the restore circuit is further configured to:
store the first data item in the first sensing circuit by activating the second word line at a second time point after the first time point; and
store the first data item stored in the first sensing circuit to the first and second memory cells by activating the first and second word lines respectively at a third time point after the second time point.

4. The memory device of claim 3, wherein the restore circuit is further configured to:
store the second data item stored in the fourth memory cell in the first sensing circuit by activating the fourth word line at a fourth time point after the third time point; and
store the second data item stored in the first sensing circuit to the third and fourth memory cell by activating the third and fourth word lines respectively at a fifth time point after the fourth time point.

5. The memory device of claim 1, wherein the restore circuit is further configured to:
activate the first and second word lines at a sixth time point after the first time point; and
activate the third and fourth word lines at a seventh time point after the sixth time point.

6. The memory device of claim 1, wherein each of the first to fourth memory cells is connected to a first bit line connected to the first sensing circuit.

7. The memory device of claim 6, wherein:
the memory cell array further includes fifth to eighth memory cells connected to the first to fourth word lines respectively;
the sense amplifier further includes a second sensing circuit configured to generate a second weighted sum based on a third weight stored in the fifth memory cell and a fourth weight stored in the seventh memory cell in response to the activation of the first and third word lines at the first time point;
the input and output circuit is further configured to output the second weighted sum to the external device in response to a second read command; and
each of the fifth to eighth memory cells is connected to a second bit line connected to the second sensing circuit.

8. The memory device of claim 6, wherein the restore operation is performed before a precharge operation for the first bit line is performed.

9. The memory device of claim 1, wherein the restore circuit is further configured to perform the restore operation in response to a precharge command received from the external device after the first time point.

10. The memory device of claim 1, wherein:
the sense amplifier further includes a buffer circuit connected between the first sensing circuit and the input and output circuit, wherein the buffer circuit is configured to store the first weighted sum, and
the input and output circuit is configured to output the first weighted sum stored in the buffer circuit to the external device in response to the first read command.

11. The memory device of claim 10, wherein the input and output circuit is configured to output the first weighted sum to the external device while the restore operation is performed.

12. An operation method of a memory device including a memory cell array including a plurality of memory cell rows respectively connected to a plurality of word lines, and a sense amplifier connected to the memory cell array through a plurality of bit lines, comprising:
activating a first word line connected to a first memory cell row and a second word line connected to a second memory cell row;
storing a first data item stored in a third memory cell row to the sense amplifier by activating a third word line connected to the third memory cell row;
storing the first data item respectively in the first memory cell row and the third memory cell row, by activating the first word line and the third word line;
storing a second data item stored in a fourth memory cell row in the sense amplifier, by activating a fourth word line connected to the fourth memory cell row; and
storing the second data item respectively in the second memory cell row and the fourth memory cell row, by activating the second word line and the fourth word line.

13. The operation method of claim 12, wherein the sense amplifier is configured to:
in response to the activating, store a first weighted sum determined based on a first weight stored in the first memory cell row and a second weight stored in the second memory cell row; and
in response to a read command received from an external device, output the first weighted sum to the external device.

14. The operation method of claim 13, wherein:
the first word line and the third word line are located adjacent to each other, and
the second word line and the fourth word line are located adjacent to each other.

15. The operation method of claim 13, wherein:
the plurality of bit lines include first and second bit lines,
the sense amplifier includes a first sensing circuit connected to the first bit line and a second sensing circuit connected to the second bit line, the first memory cell row includes a first memory cell connected to the first bit line and a second memory cell connected to the second bit line, the second memory cell row includes a third memory cell connected to the first bit line and a fourth memory cell connected to the second bit line;

the third memory cell row includes a fifth memory cell connected to the first bit line and a sixth memory cell connected to the second bit line; and the fourth memory cell row includes a seventh memory cell connected to the first bit line and an eighth memory cell connected to the second bit line.

16. An operation method of a memory system comprising a memory device and a host device, wherein the memory device includes a first plurality of memory cells connected to a first plurality of word lines and a second plurality of memory cells connected to a second plurality of word lines, comprising:

providing, by the host device, a multi-activate command to the memory device;

activating, by the memory device, the first plurality of word lines in response to the multi-activate command; and performing, by the memory device, a restore operation for the first plurality of memory cells based on the second plurality of memory cells after the first plurality of word lines are activated.

17. The operation method of claim 16, further comprising:

providing, by the host device, a first read command to the memory device; and outputting, by the memory device, a first sum of weights stored in memory cells connected to a first bit line among the first plurality of memory cells to the host device, in response to the first read command.

18. The operation method of claim 16, further comprising:

providing, by the host device, a second read command to the memory device; and outputting, by the memory device, a second sum of weights stored in the memory cells connected to a second bit line among the second plurality of memory cells to the host device, in response to the second read command.

19. The operation method of claim 16, wherein the memory device includes a sense amplifier, and the performing the restore operation includes:

activating a first word line of the first plurality word lines and a second word line of the second plurality of word lines; and activating a third word line of the first plurality of word lines and a fourth word line of the second plurality of word lines.

20. The operation method of claim 16, after the performing the restore operation, further comprising:

entering, by the memory device, into an idle state.

* * * * *